(12) United States Patent
Sakuma et al.

(10) Patent No.: US 10,393,557 B2
(45) Date of Patent: Aug. 27, 2019

(54) THERMAL FLUID FLOW SENSOR

(71) Applicant: HITACHI AUTOMOTIVE SYSTEMS, LTD., Ibaraki (JP)

(72) Inventors: Noriyuki Sakuma, Tokyo (JP); Yasuo Onose, Ibaraki (JP); Shinobu Tashiro, Ibaraki (JP); Ryosuke Doi, Ibaraki (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 115 days.

(21) Appl. No.: 15/535,179

(22) PCT Filed: Nov. 26, 2015

(86) PCT No.: PCT/JP2015/083201
§ 371 (c)(1),
(2) Date: Jun. 12, 2017

(87) PCT Pub. No.: WO2016/111096
PCT Pub. Date: Jul. 14, 2016

(65) Prior Publication Data
US 2017/0328754 A1    Nov. 16, 2017

(30) Foreign Application Priority Data
Jan. 9, 2015    (JP) ................. 2015-003261

(51) Int. Cl.
*G01F 1/684* (2006.01)
*B81B 1/00* (2006.01)
*G01F 1/692* (2006.01)

(52) U.S. Cl.
CPC ............. *G01F 1/6845* (2013.01); *B81B 1/00* (2013.01); *G01F 1/692* (2013.01)

(58) Field of Classification Search
CPC ................. G01F 1/6845; G01F 1/692
See application file for complete search history.

(56) References Cited

U.S. PATENT DOCUMENTS 7,154,372 B2    12/2006   Vanha et al.
8,429,964 B2    4/2013    Sakuma
(Continued)

FOREIGN PATENT DOCUMENTS

CN    101750123 A    6/2010
EP    1350078 A1    10/2003
(Continued)

OTHER PUBLICATIONS

International Search Report for WO 2016/111096 A1, dated Dec. 28, 2015.
(Continued)

*Primary Examiner* — Justin N Olamit
(74) *Attorney, Agent, or Firm* — Volpe and Koenig, P.C.

(57) ABSTRACT

Degradation of reliability of a thermal fluid flow sensor, caused by generation of a crack in an insulating film is prevented in the thermal fluid flow sensor including a detection section and a circuit section formed on the same substrate when stress adjustment is performed by forming a deep concave portion in an interlayer insulating film in the detection section and forming the insulating film having a tensile stress thereon. As a means thereof, stair-like step is provided in a side wall of a concave portion, formed in the interlayer insulating film on a diaphragm. Accordingly, each depth of a first concave portion and a second concave portion, which form the concave portion, is reduced, and coatability of the insulating film for the stress adjustment, which covers a side wall and a bottom face of the concave portion, is improved.

6 Claims, 17 Drawing Sheets

(56) References Cited

U.S. PATENT DOCUMENTS

| | | | |
|---|---|---|---|
| 8,714,008 B2 | 5/2014 | Sakuma | |
| 9,851,233 B2* | 12/2017 | Sakuma | ............ H01L 23/16 |
| 2003/0019290 A1 | 1/2003 | Iwaki et al. | |
| 2007/0231942 A1 | 10/2007 | Vanha et al. | |
| 2012/0240674 A1* | 9/2012 | Sakuma | ............ G01F 1/6845 |
| | | | 73/204.25 |

FOREIGN PATENT DOCUMENTS

| | | |
|---|---|---|
| EP | 2348292 A1 | 7/2011 |
| EP | 2531821 A2 | 12/2012 |
| JP | 2000-097793 A | 4/2000 |
| JP | 2004-518119 A | 6/2004 |
| JP | 2012-202786 A | 10/2012 |
| JP | 2012-208061 A | 10/2012 |
| JP | 2015-224993 A | 12/2015 |
| WO | 2014/097723 A1 | 6/2014 |

OTHER PUBLICATIONS

Extended European Search Report dated Aug. 30, 2018 for the European Patent Application No. 15876969.5.
Communication Pursuant to Rule 114(2) EPC for the European Patent Application No. 15876969.5 dated Oct. 25, 2018.

* cited by examiner

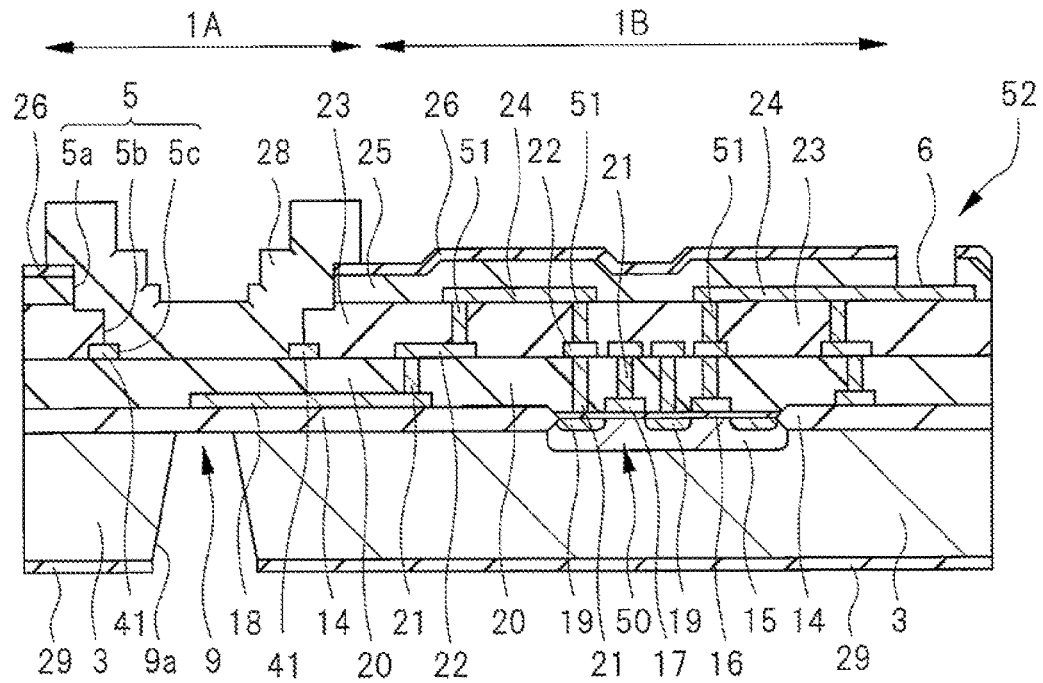
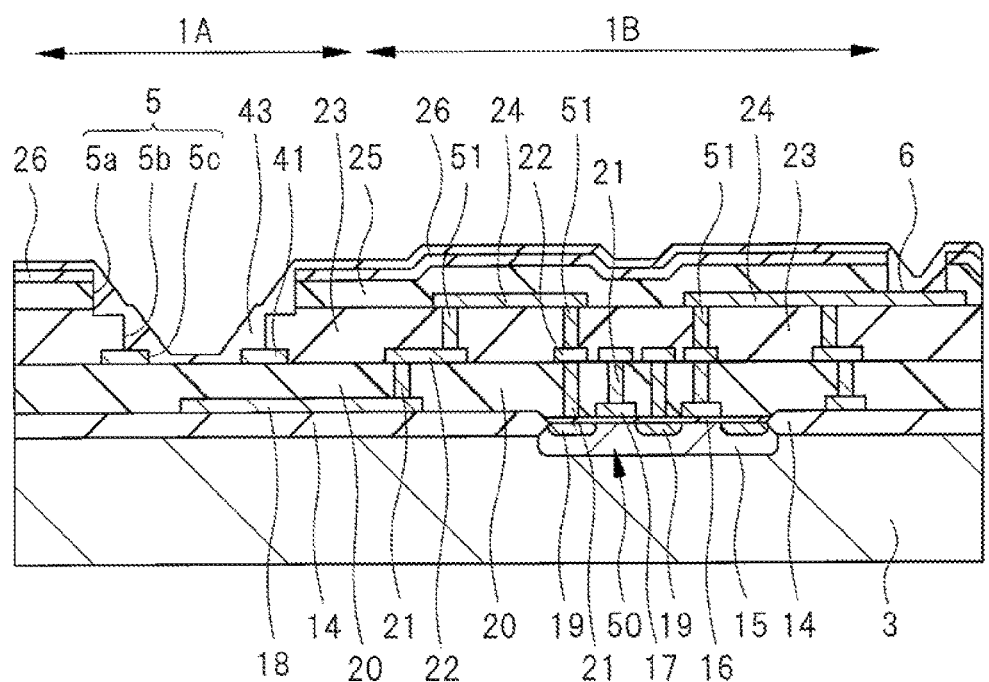
FIG. 21

THERMAL FLUID FLOW SENSOR

TECHNICAL FIELD

The present invention relates to a thermal fluid flow sensor, and particularly a technique which is advantageous when being applied to a thermal fluid flow sensor that uses a heating resistor.

BACKGROUND ART

Currently, air flow meters, provided in an electronic controlled fuel injection apparatus of an internal combustion engine such as an automobile to measure an intake air amount have been used. Further, thermal fluid flow sensors using a heating resistor have attracted attention as a fluid flow sensor used in such the air flow meter in terms that it is possible to directly detect a mass air flow.

Among them, a thermal air flow sensor, that is, an air flow sensor, which is manufactured by a micro electro mechanical systems (MEMS) technique using a semiconductor, can reduce the manufacturing cost and be driven, which has attracted attention.

As such a thermal fluid flow sensor, there is a sensor which includes a heating resistor and in which a flow detection section to detect a flow rate of a fluid and a circuit section to perform to perform control of the flow detection section or the like are formed on the same substrate. In this case, it is unnecessary to electrically connect the flow detecting substrate and the circuit substrate using a method such as wire bonding, which can reduce the number of parts.

PTL 1 (JP 2004-518119 A) discloses a micromechanical flow sensor in which a measuring element and a circuit are integrated in a semiconductor substrate, and the measuring element is provided on an opening of the semiconductor substrate or a recess.

PTL 2 (JP 2012-202786 A) discloses a thermal fluid flow sensor that includes a detection part, which includes a heating resistor provided on a first stacked film on a semiconductor substrate, and a circuit part which is provided on the semiconductor substrate and includes a control circuit and to control the heating resistor.

CITATION LIST

Patent Literature

PTL 1: JP 2004-518119 A
PTL 2: JP 2012-202786 A

SUMMARY OF INVENTION

Technical Problem

There is a case where a flow detection section has a compressive stress in the thermal fluid flow sensor which includes the flow detection section and the circuit section formed on the same substrate. In this case, there is a risk that the flow detection section is damaged since the flow detection section can be easily deflected.

Meanwhile, when the flow detection section has a tensile stress, the flow detection section is hardly deflected and there is a little risk that the flow detection section is damaged. However, there is a case where the circuit section has a tensile stress when the flow detection section has the tensile stress. In this case, there occurs a problem in which characteristics of the circuit section changes.

Other objects and novel characteristics in addition to the above-described ones of the present invention will be apparent from description of the present specification and the attached drawings.

Solution to Problem

An overview of representatives among embodiments to be disclosed in the present application will be simply described as follows.

A thermal fluid flow sensor as an embodiment includes a stair-like step that is provided in a side wall of a concave portion in which an interlayer insulating film is formed on a diaphragm of a sensor chip, that is, the concave portion having the side wall and a bottom face covered by an insulating film for stress adjustment.

Advantageous Effects of Invention

An effect that can be obtained by the representatives of the invention to be disclosed in the present application will be simply described as follows.

According to the present invention, it is possible to improve the reliability of the thermal fluid flow sensor.

BRIEF DESCRIPTION OF DRAWINGS

FIG. 20 is a cross-sectional view during the process of manufacturing the thermal fluid flow sensor continuous to FIG. 19.

FIG. 21 is a cross-sectional view of a process of manufacturing a thermal fluid flow sensor according to a third embodiment.

DESCRIPTION OF EMBODIMENTS

Figure 1:
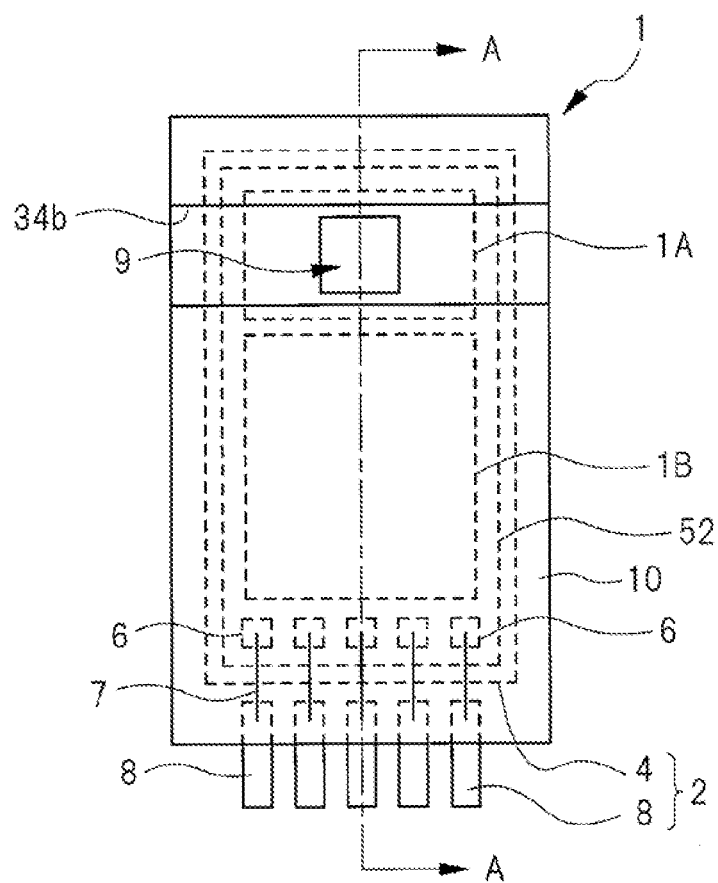
FIG. 1 is a plan view illustrating a thermal fluid flow sensor according to a first embodiment.

Hereinafter, embodiments of the present invention will be described in detail based on the drawings. Incidentally, the same reference numerals will be attached to members having the same function, in the entire drawing for describing the respective embodiments, and the repetitive description thereof will be omitted. In addition, the description of the same or similar portions will not be repeated in principle unless particularly required in the following embodiments.

(First Embodiment)

A thermal fluid flow sensor according to an embodiment of the present invention will be described with reference to the drawings. The thermal fluid flow sensor according to the present embodiment is a thermal fluid flow sensor that detects a flow rate of a fluid using a heating resistor.

<Configuration of Thermal Fluid Flow Sensor>

Figure 2:
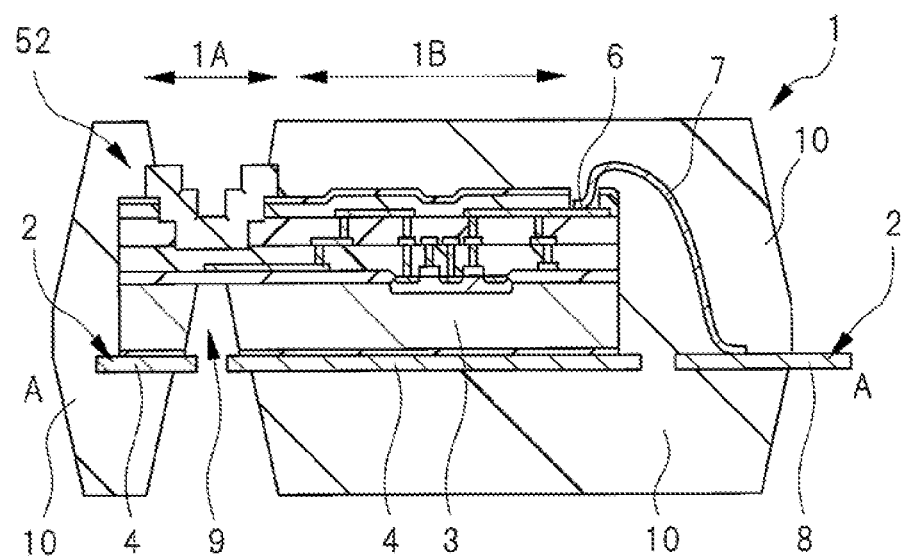
FIG. 2 is a cross-sectional view taken along a line A-A of FIG. 1.
Figure 3:
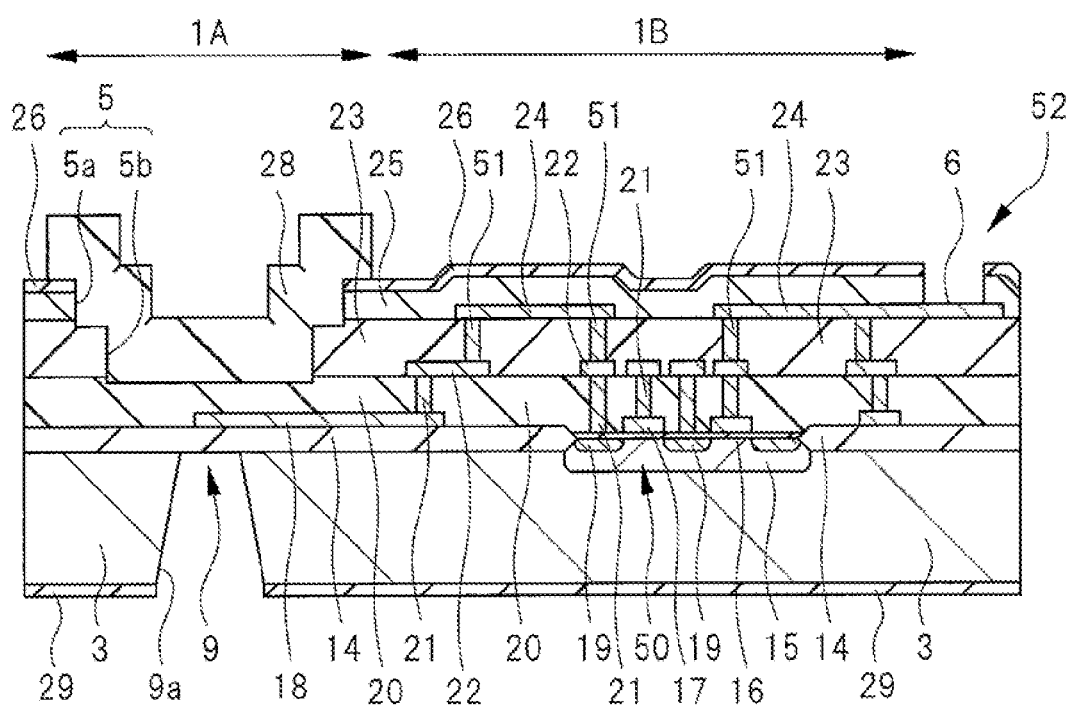
FIG. 3 is a cross-sectional view of a sensor chip in the thermal fluid flow sensor according to the first embodiment.
Figure 4:
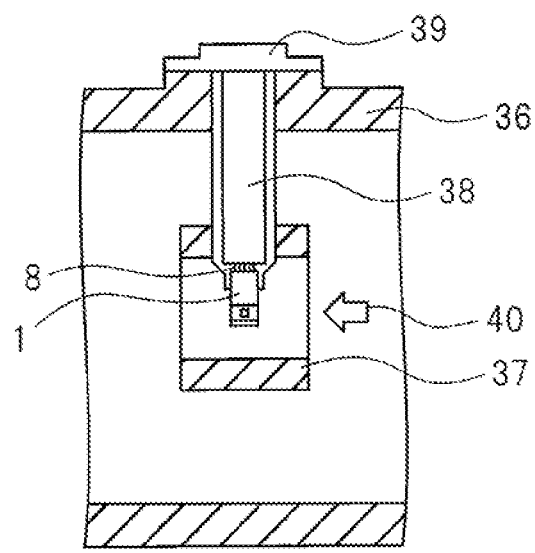
FIG. 4 is a schematic view of a thermal air flow meter that includes the thermal fluid flow sensor according to the first embodiment.

Hereinafter, a structure of the thermal fluid flow sensor according to the present embodiment will be described with reference to FIGS. 1 to 4. FIG. 1 is a plan view illustrating the thermal fluid flow sensor according to the present embodiment. FIG. 2 is a cross-sectional view taken along a line A-A of FIG. 1. FIG. 3 is a cross-sectional view of a sensor chip in the thermal fluid flow sensor according to the present embodiment. That is, FIG. 3 is the cross-sectional view of the main part of the thermal fluid flow sensor illustrated in FIG. 2. FIG. 4 is a schematic view of a thermal air flow meter which includes the thermal fluid flow sensor according to the present embodiment that is, attached to an intake passage of an internal combustion engine such as an automobile.

As illustrated in FIGS. 1 and 2, a thermal fluid flow sensor 1 include a lead frame 2 and a sensor chip 52 mounted on an upper face of the lead frame 2. A part of the lead frame 2 and a part of the sensor chip 52 are covered by a mold resin 10. FIG. 1 illustrates each contour of structural bodies covered by the mold resin 10 using a dashed line. An air flow path Groove 34b, configured to prevent hindrance of flow of air, is formed on an upper face of the mold resin 10.

The lead frame 2 includes a substrate mounting portion 4 and a plurality of external terminals (leads) 8 which are isolated from each other. The substrate mounting portion 4 is a metal plate with a sensor chip 52 mounted on an upper face thereof. Some of the external terminals 8 are metal plates which are exposed from the mold resin 10 and serve a role of electrically connecting a circuit formed in the sensor chip 52 and an outside of the thermal fluid flow sensor 1. The lead frame 2 is made of, for example, an alloy mainly containing Cu (copper).

The sensor chip 52 includes a semiconductor substrate 3 (see FIG. 2) at a bottom thereof, and an air flow measurement section 1A and a circuit section 1B which are arrayed side by side in a direction along a main face of the semiconductor substrate 3. In addition, a plurality of electrode pads (electrodes) 6 for input and output with respect to the outside are formed on the upper face of the sensor chip 52, and the electrode pad 6 and the external terminal 8 are electrically connected to each other via a bonding wire 7. The air flow measurement section 1A is a portion to detect the flow rate of the fluid and is a region that includes the heating resistor (heater) formed on the semiconductor substrate 3 and a sensor (not illustrated) that detects heat.

A diaphragm 9, which is a region in which a film thickness of the sensor chip 52 is thin, is formed in the air flow measurement section 1A. The heater and the sensor are formed side by side at a position overlapping the diaphragm 9 when seen in a plan view. In addition, the heater, the sensor, and the diaphragm 9 are arranged at the position overlapping the air flow path groove 34b when seen in a plan view. In addition, the air flow path groove 34b extends in the array direction of the heater and the sensor.

The circuit section 1B is a part of the sensor chip 52 and is a portion in which a MOS (Metal Oxide Semiconductor) transistor, a diode, a memory, and the like to control heating of the heater are formed on the semiconductor substrate 3 in addition, a circuit, which receives power supply from the outside and performs output of the air flow rate to the outside via the electrode pad 6 and the external terminal 8, is formed in the circuit section 1B.

As illustrated in FIG. 2, each of the substrate mounting portion 4 and the sensor chip 52, as a part of the lead frame 2, is covered by the mold resin 10 except for the air flow measurement section 1A. In addition, the external terminal 8 as a part of the lead frame 2 has one end exposed from the mold resin 10 and the other end covered by the mold resin 10. The end of the external terminal 8 and the electrode pad 6 are connected to each other via the bonding wire 7 inside the mold resin 10.

In the air flow measurement section 1A, the mold resin 10 is opened at each side of the main face of the semiconductor substrate 3 and a rear face thereof which is on the opposite side of the main face. A concave portion of the mold resin 10 on the main face side of the semiconductor substrate 3 and the concave portion of the mold resin 10 on the rear face side of the semiconductor substrate 3 are formed at overlapping positions when seen in a plan view. The semiconductor substrate 3 on the bottom of the sensor chip 52 and an insulating film on a top of the sensor chip 52 are opened in a region between of the concave portions of the mold resin 10 on the main face and the rear face of the semiconductor substrate 3, and a film thickness of the sensor chip 52 in the region is smaller than a film thickness of the sensor chip 52 in the other region.

That is, a part of the semiconductor substrate 3 is removed to form a hole 9a (see FIG. 3) in the air flow measurement section 1A, and the concave portion is formed on the upper face of the sensor chip 52 immediately above the hole. Thus, the air flow measurement section 1A has the region in which the thickness of the sensor chip 52 is smaller than a thickness of the circuit section 1B.

In the present application, such a portion in which the sensor chip 52 is formed to be thin is referred to as the diaphragm 9. The diaphragm 9 is a portion formed with the hole which opens the semiconductor substrate 3 to prevent an excessive increase of temperature of the air flow measurement section 1A including the heater. In addition, the diaphragm 9 is a portion in which the concave portion is formed in the top of the sensor chip 52 in order to prevent damage of the sensor chip 52 in the air flow measurement section 1A and to adjust a stress of the air flow measurement section 1A as will be described later with reference to FIG. 14. That is, the diaphragm (diaphragm or a diaphragm structure) indicates a part of the sensor chip 52 having a small thickness between the concave portion and the hole 9a.

Herein, an opening penetrating through the substrate mounting portion 4 is formed as a hole for confidentiality prevention in order to cause air to flow into the hole penetrating through the semiconductor substrate 3. That is, the concave portion of the mold resin 10 on the rear face side of the semiconductor substrate 3, the opening penetrating through the substrate mounting portion 4, the hole penetrating through the semiconductor substrate 3, the concave portion on the upper face of the sensor chip 52, and the concave portion of the mold resin 10 on the main face side of the semiconductor substrate 3 are formed at overlapping positions when seen in a plan view. Accordingly, the opening penetrating through the substrate mounting portion 4 and the hole 9a (see FIG. 3) on the rear face side of the semiconductor substrate 3 are exposed from the mold resin 10 immediately above the concave portion on the rear face side of the mold resin 10 in the air flow measurement section 1A.

As described above, the flow detection section to detect the flow rate of the fluid and the circuit section to perform control of the flow detection section or the like are formed on the same semiconductor substrate 3 in the present embodiment. In regard to this, it is possible to consider a configuration in which a flow detection section to detect a flow rate of a fluid and a circuit section to perform calculation of flow rate conversion for control of the flow detection section or external output are formed on substrates which are different from each other. In this case, it is necessary to electrically connect a flow detecting substrate in which the flow detection section is formed and a circuit substrate in which a control circuit and the like are formed using a method such as wire bonding. Thus, the number of parts increases, and the number of steps in the manufacturing process increases as an inspection process is additionally performed after an assembly process of assembling the flow detecting substrate and the circuit substrate. Further, there is a risk that the yield decreases as a defect is generated in the assembly process, and there occurs a problem that the manufacturing cost increases.

On the contrary, it is unnecessary to electrically connect the flow detecting substrate and the circuit substrate using the method such as wire bonding in the present embodiment since the air flow measurement section 1A and the circuit section 1B are present on the same substrate. Accordingly, it is possible to decrease the number of parts.

Next, a structure of the sensor chip 52 will be described with reference to FIG. 3. The sensor chip 52 includes the semiconductor substrate 3 made of, for example, single-crystal silicon. A bottom face of the semiconductor substrate 3 is covered by an insulating film 29 made of, for example, a silicon oxide film. In the circuit section 1B, a well 15 is formed from the main face of the semiconductor substrate 3 to a middle depth in an active region of the semiconductor substrate 3. A plurality of diffusion layers 19 are formed from the main face of the semiconductor substrate 3 to a middle depth on upper face the well 15. The diffusion layer 19 is a semiconductor region that is formed with a shallower depth than the well 15. The well 15 and the diffusion layer 19 have conductivity types different from each other.

A gate electrode 17 is formed on the upper face of the well 15, that is, the upper face of the semiconductor substrate 3 in the active region with a gate insulating film 16 interposed therebetween. The gate insulating film 16 is made of, for example, a silicon oxide film, and the gate electrode 17 is made of, for example, a polysilicon film. The gate insulating film 16 and the gate electrode 17 are formed immediately above each region between a pair of the diffusion layers, and the gate electrode 17 and a pair of the diffusion layers 19 with the main face of the semiconductor substrate 3, immediately below the gate electrode, interposed therebetween form a MOS transistor 50. The pair of diffusion layers 19 with the main face of the semiconductor substrate 3, immediately below the gate electrode, interposed therebetween form source and drain regions of the MOS transistor 50, respectively. The main face of the semiconductor substrate 3 between the pairs of the diffusion layers 19 is a channel region in which a channel is formed during operation of the MOS transistor 50.

A plurality of the MOS transistors 50 are illustrated and other elements are not illustrated in the circuit section 1B in FIG. 3 Elements such as a memory and a diode are formed on the semiconductor substrate 3 in a region that is not illustrated. The respective elements formed on the semiconductor substrate 3 are isolated from each other by an element isolation region 14 formed on the semiconductor substrate 3 among the respective elements. The element isolation region 14 is made of, for example, a silicon oxide film, and is formed from the main face of the semiconductor substrate 3 to a middle depth in a region (field region) neighboring on the active region. The element isolation region 14 is formed on the air flow measurement section 1A as well as the portion between the elements of the circuit section 1B.

Since the hole 9a penetrating through the semiconductor substrate 3 is formed in the air flow measurement section 1A, the portion in which the thickness of the sensor chip 52 is thin, that is, the diaphragm 9 is formed therein. Since the insulating film 29 immediately below the hole 9a is removed, a bottom face of the element isolation region 14 positioned immediately above the hole 9a is exposed from the semiconductor substrate 3 and the insulating film 29.

In the air flow measurement section 1A, a heater 18 and a sensor (not illustrated) are formed on the element isolation region 14. The heater (the heating resistor) 18 and the sensor (measuring element) are isolated and electrically insulated from each other. However, the heater 18 and the sensor are formed using conductive films on the same layer which are made of the same materials. The sensor is configured to detect temperature of air that has been warmed by heat generated in the heater 18. Examples of systems of performing the detection of temperature using the sensor include a heat resistance type, a thermocouple type, or the like.

The heater 18 and the sensor are arranged side by side in a direction along the main face of the semiconductor substrate 3 as a depth direction in FIG. 3, that is, a direction orthogonal to the line A-A in FIG. 1. The heater 18 is arranged to be interposed between a pair of sensors.

The heater 18, the sensor, and the MOS transistor 50 are covered by an interlayer insulating film 20 that is formed on the semiconductor substrate 3 and the element isolation region 14. The interlayer insulating film 20 is made of, for example, a silicon oxide film. A plurality of contact holes (connection holes) are formed in the interlayer insulating film 20, and a contact plug 21 mainly containing, for example, W (tungsten) is formed in each of the contact holes. An upper face of the interlayer insulating film 20 and each upper face of the plurality of contact plugs 21 are flattened to have the same height. Incidentally, the height referred in the present application indicates a distance in a direction vertical to the main face of the semiconductor substrate 3 from a main face of the semiconductor substrate 3 at a specific position.

The plurality of contact plugs 21 are connected, respectively, to an upper face of the heater 18, an upper face of the sensor (not illustrated), an upper face of the diffusion layer 19, an upper face of the gate electrode 17, and the like.

A plurality of wirings 22 mainly containing, for example, Al (aluminum) are formed on each of the interlayer insulating film 20 and the contact plug 21. A bottom of the wiring 22 is connected to the upper face of the contact plug 21. The upper face of the interlayer insulating film 20 and the wiring 22 are covered by an interlayer insulating film 23 formed on the interlayer insulating film 20. The interlayer insulating film 23 is made of, for example, a silicon oxide film.

A plurality of contact plug holes are formed in the interlayer insulating film 23, and a plurality of contact plugs 51 mainly containing, for example, W (tungsten) are embedded in the respective contact plug holes. An upper face of the interlayer insulating film 23 and each upper face of the plurality of contact plugs 51 are flattened to have the same height. A plurality of wirings 24 mainly containing, for example, Al (aluminum) are formed on the interlayer insulating film 23 and the contact plug 51. A lower face of the wiring 24 is connected to the upper face of the contact plug 51. The wirings 24 are connected to the heater 18, the sensor (not illustrated), the gate electrode 17, the diffusion layer 19, and the like via the contact plug 51, the wiring 22, and the contact plug 21.

An insulating film 25, which is made of a silicon oxide film, for example, and a protective film 26, which is an insulating film made of a silicon nitride film, for example, are formed in this order on the interlayer insulating film 23 so as to cover the wiring 24. Some of the wirings 24 have a part of an upper face exposed from the insulating film 25 and the protective film 26. The upper face of the wiring 24 exposed from the insulating film 25 and the protective film 26 forms the electrode pad 6. The electrode pad 6 is a portion that connects the bonding wire to the upper face of the wiring 24.

The insulating film 25, the protective film 26, the interlayer insulating film 20, and the element isolation region 14 are films each of which has a compressive stress therein. In other words, the insulating film 25, the protective film 26, the interlayer insulating film 20, and the element isolation region 14 have the stress on a compression side. Here, it is possible to improve protection performance and moisture resistance of the wirings 22 and 24 by employing the film having the compressive stress for the insulating film 25, the protective film 26, and the interlayer insulating film 20.

A concave portion 5 is formed on an upper face of a stacked film including the protective film 26, the insulating film 25, and the interlayer insulating films 23 and 20 in the air flow measurement section 1A in a region overlapping the hole 9a when seen in a plan view. The concave portion 5 is a concave portion reaching a middle depth of the stacked film from the upper face of the stacked film, and a bottom face of the concave portion 5 is positioned above the heater 18 and the sensor (not illustrated). That is, the heater 18 and the sensor (not illustrated) are not exposed inside the concave portion 5. A depth of the concave portion 5, that is, a distance thereof from an upper face of the protective film 26 to the bottom face of the concave portion 5 in the direction vertical to the main face of the semiconductor substrate 3 is about 2.5 μm.

The concave portion 5 is configured of a plurality of concave portions 5a and 5b. The concave portion 5b is formed immediately below the concave portion 5a, and an opening width of the concave portion 5a is larger than an opening width of the concave portion 5b. That is, the concave portion 5 includes the concave portion 5a formed on the upper face of the stacked film and the concave portion 5b formed on the bottom face of the concave portion 5a. Incidentally, the opening width referred herein is a width of each concave portion in the direction along the main face of the semiconductor substrate 3.

In addition, a side wall of the concave portion 5b does not overlap a side wall of the concave portion 5a when seen in a plan view. That is, the concave portion 5b is formed at an inner side than the side wall of the concave portion 5a, and the side wall of the concave portion 5b and the side wall of the concave portion 5a are isolated from each other when seen in a plan view. Accordingly, stair-like steps are formed on a side wall of the concave portion 5. That is, an opening width of the concave portion 5 increases in a stepwise manner from the bottom of the concave portion 5 in an upward direction. Herein, one step formed using the bottom face of the concave portion 5a and the side wall of the concave portion 5b is formed inside the concave portion 5.

The concave portion 5a penetrates through the insulating film 25 and reaches a middle depth of the interlayer insulating film 23 as illustrated in FIG. 3, for example. However, the concave portion 5a may be a concave portion that does not penetrate through the insulating film 25 but reaches a middle depth of the insulating film 25. The concave portion 5b penetrates through the interlayer insulating film 23 and reaches a middle depth of the interlayer insulating film 20 as illustrated in FIG. 3, for example. However, the concave portion 5b may be a concave portion that does not penetrate through the interlayer insulating film 23 but reaches a middle depth of the interlayer insulating film 23.

In addition, a bottom face of the concave portion 5b may be provided with an additional concave portion having a smaller opening width than the concave portion 5b. In this case, the number of steps of the side wall of the concave portion 5 increases so that each depth of the concave portions forming the concave portion 5 decreases.

A surface of the stacked film at the inner side of the concave portion 5 is covered by the insulating film 28. The insulating film 28 is a film having a tensile stress, and is made of, for example, a silicon nitride film. In other words, the insulating film 28 has a stress on the tensile stress side as compared to the insulating film 25, the protective film 26, the interlayer insulating film 20, and the element isolation region 14.

The insulating film 28 is formed only in the air flow measurement section 1A, and is not formed in the circuit section 1B. That is, the element such as the MOS transistor 50 formed in the circuit section 1B is covered by the insulating film 25 and the protective film 26 which have the compressive stress, but is not covered by the insulating film 28 having the tensile stress. In addition, the heater 18 and the sensor of the air flow measurement section 1A are covered by the insulating film 28 having the tensile stress, but are not covered by the insulating film 25 and the protective film 26 which have the compressive stress.

As being formed in the region having the tensile stress, the semiconductor element such as the MOS transistor 50 receives influence so that a resistance value thereof increases or the like. In order to prevent such a change in characteristics, the circuit section 1B including the element such as the MOS transistor 50 ix exposed from the insulating film 28 having the tensile stress.

Herein, the insulating film 28 as a stress adjusting film is provided in order to make the stress of the diaphragm 9 of the air flow measurement section 1A act as the tensile stress. However, the silicon nitride film forming the insulating film 28 is formed at low temperature and is a film having a small tensile stress. Thus, it is necessary to form the insulating film 28 with an extremely large film thickness in order to make the stress of the stacked film act as the tensile stress by forming the insulating film 28 on the Protective film 26 that is an uppermost layer of the stacked film including the interlayer insulating films 20 and 23, the insulating film 25, and the protective film 26 which have the compressive stress.

Thus, the stress adjustment of the air flow measurement section 1A using the insulating film 28 having a small film thickness is enabled, herein, by removing the insulating film 25, the protective film 26, and the like, which are on the top of the stacked film, and forming the concave portion 5 in the air flow measurement section 1A. However, it is necessary to form the concave portion 5 having a depth of about 2.5 μm in order to reduce the compressive stress by forming the concave portion 5 on the upper face of the stacked film. Such a depth of the concave portion 5 causes a problem relating to coverage in a comparative example which will be described later with reference to FIG. 30.

Incidentally, both the protective film 26 and the insulating film 28 are made using the silicon nitride film, but the protective film 26 has the compressive stress, and the insulating film 28 has the tensile stress as described above. Even when the same films made using the silicon nitride film are used, it is possible to change a direction of an internal stress, as described above, by changing a film formation condition.

The insulating film 28 is not completely embedded in the concave portion 5. That is, a film thickness of the insulating film 28 is smaller than the depth of the concave portion 5. Accordingly, the insulating film 28 is formed along the side wall and the bottom face of each of the concave portions 5a and 5b. Accordingly, a concave portion is formed on the upper face of the insulating film 28 along a surface shape of the concave portion 5, and stair-like steps are formed on the side wall of the concave portion. Herein, the hole 9a, the interlayer insulating film 20, the concave portions 5a and 5b, and the insulating film 28 are formed at positions overlapping the heater 18 and the sensor (not illustrated) when seen in a plan view.

Herein, the insulating film 28 is formed to have a larger film thickness than any depth of the concave portions 5a and 5b. In other words, the film thickness of the insulating film 28 is larger than a height of a step formed like a stair in the side wall of the concave portion 5. The step formed in the side wall of the concave portion 5 are configured using the bottom face of the concave portion 5a and the side wall of the concave portion 5b. The height of the step referred herein indicates a distance from an upper end to a lower end of the side wall of the concave portion 5b forming the corresponding step in the direction vertical to the main face of the semiconductor substrate 3.

In other words, the height of the step indicates a distance from the bottom face of the concave portion 5a serving as an upper face of the step to the bottom face of the concave portion 5b positioned at a lower end of the step in the direction vertical to the main face of the semiconductor substrate 3, for example. In addition, the height of the step indicates a distance from the upper face of the protective film 26 at an outer side of the concave portion 5 to the bottom face of the concave portion 5a in the direction vertical to the main face of the semiconductor substrate 3, for example. That is, the height of the step indicates a difference in height from an upper face to a lower end of a certain step.

Herein, it is possible to improve coatability of the insulating film 28 by forming the film thickness of the insulating film 28 to be larger than any depth of the concave portions 5a and 5b.

The insulating film 28 is a film that is provided to prevent the damage of the sensor chip 52. The diaphragm 9 is formed in the air flow measurement section 1A, and thus, the thickness of the sensor chip 52 is small therein. In addition, it is possible to consider that the air flow measurement section 1A of the sensor chip 52 has the compressive stress as a whole since the interlayer insulating film 20, the element isolation region 14, and the like have the compressive stress. In thio case, there is a risk that a deflection occurs in the sensor chip 52 in the air flow measurement section 1A, thereby damaging the sensor chip 52. In regard to this, it is possible to prevent the damage of the sensor chip 52 by forming the insulating film 28 having the tensile stress on the diaphragm 9 and increasing the entire tensile stress of the air flow measurement section 1A of the sensor chip 52.

Next, a description will be given regarding a structure of the thermal air flow meter attached to the intake passage of the internal combustion engine such as the automobile with reference to FIG. 4. As illustrated in FIG. 4, the thermal air flow meter is configured of the thermal fluid flow sensor 1, which is the thermal fluid flow sensor according to the present embodiment, a supporting member 38 that supports the thermal fluid flow sensor 1, and a linking member 39 that electrically connects the outside of the thermal fluid flow sensor 1 and the external terminal 8 of the thermal fluid flow sensor 1. The thermal fluid flow sensor 1 is arranged inside a tubular auxiliary passage 37 which is present inside a tubular air passage 36. Intake air 40 indicated by an arrow in FIG. 4 flows in an air flow direction indicated by the arrow or a reverse direction thereof depending on a condition of the internal combustion engine.

Herein, it is possible to detect a flow direction and a flow rate of air as the pair of sensors (not illustrated) detects, arranged with the heater 18 interposed therebetween in a direction along the air flow direction inside the auxiliary passage 37 (see FIG. 4), heat generated in the heater 18 (see FIG. 3) arranged at the center of the air flow measurement section 1A illustrated in FIG. 1. That is, it is possible to calculate the air flow rate by causing the heater 18 to generate heat and detecting a difference of the resistance value or the like caused between the pair of sensors when the air flows into the auxiliary passage 37. Thus, the sensors are arranged on an upstream side and a downstream side, respectively, with respect to the heater 18.

Herein, the concave portion 5 illustrated in FIG. 3 is formed immediately above the heater 18 and the sensor such that the heat generated in the heater 18 is transmitted to the sensor via the air flowing inside the auxiliary passage 37. That is, the concave portion 5 is provided to reduce the film thickness of the insulating film on each of the heater 18 and the sensor in order to enhance measurement accuracy of the air flow rate.

<Effect of Thermal Fluid Flow Sensor According to Present Embodiment>

Figure 30:
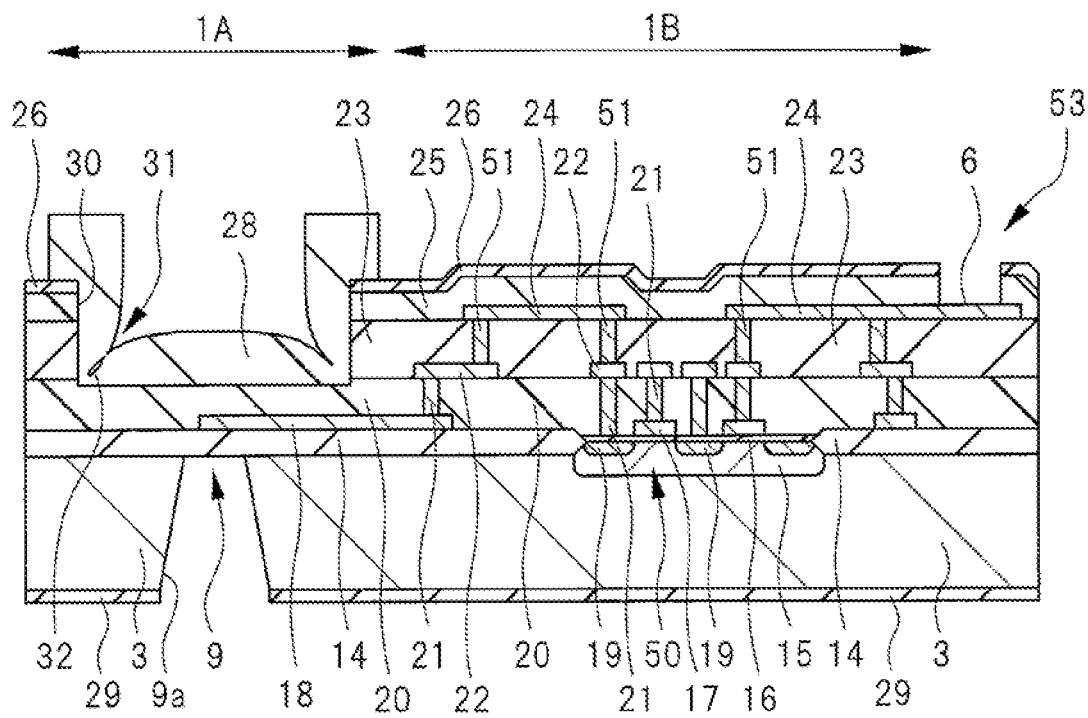
FIG. 30 is a cross-sectional view of a sensor chip in a thermal fluid flow sensor according to a comparative example.

An effect of the thermal fluid flow sensor according to the present embodiment will be described with reference to a comparative example illustrated in FIG. 30. FIG. 30 is a cross-sectional view of a sensor chip of a thermal fluid flow sensor according to the comparative example.

In a sensor chip 53 according to the comparative example illustrated in FIG. 30, a shape of a concave portion 30, which is opened in an upper face of a stacked film including the interlayer insulating films 20 and 23, the insulating film 25, and the protective film 26 in the air flow measurement section 1A, is different from a shape of the concave portion 5 according to the present embodiment illustrated in FIG. 3. In addition, the sensor chip 53 according to the comparative example and the sensor chip 52 (see FIG. 3) according to the present embodiment are different from each other in terms of a shape of the insulating film 28. Except for these points, the sensor chip 53 according to the comparative example and the sensor chip 52 according to the present embodiment have the same structure.

The concave portion 30 according to the comparative example is a concave portion that reaches a middle depth from the upper face of the stacked film, and the heater 18 and the sensor (not illustrated) are not exposed at an inner side thereof. A depth of the concave Portion 30 is the same as that of the concave portion 5 (see FIG. 3) according to the present embodiment, and is about 2.5 µm, for example. The concave portion 30 according to the comparative example does not include a plurality of concave portions differently from the present embodiment, and thus, a side wall of the concave portion 30 is formed in a linear shape from an upper end of the side wall to a bottom face of the concave portion 30. Thus, a step is not formed in the side wall of the concave portion 30.

Accordingly, the depth of the concave portion 30 is larger than any depth of the concave portions 5a and 5b illustrated in FIG. 3. That is, the insulating film 28 according to the comparative example is formed so as to cover the side wall and the bottom face of the concave portion 30 which is deeper than the concave portions 5a and 5b illustrated in FIG. 3. The depth of the concave portion referred in the present application indicates a distance from the upper end of the side wall of the concave portion to the bottom face of the concave portion in the direction vertical to the main face of the semiconductor substrate 3.

In the case of forming the insulating film 28 so as to cover a side wall and a bottom face inside a deep concave portion, such as the concave portion 30, it is difficult to the insulating film 28 that covers the side wall and the bottom face. That is, the coverage of the insulating film 28 deteriorates. Thus, a void 32 is easily formed inside the insulating film 28 particularly at a boundary between the side wall and the bottom face of the concave portion 30, that is, in the vicinity of a corner 31. When the void 32 is formed, the film thickness of the insulating film 28 is extremely decreased locally at the corner 31. In addition, a stress is concentrated on the insulating film 28 stacked on the corner at the bottom of the concave portion when the coverage deteriorates because the depth of the concave portion in which the insulating film 28 is embedded is deep.

There is a risk that a crack occurs in the insulating film 28 in which the void 32 is formed and the stress concentration is caused when receiving a heat-resistant stress due to the use of the heater 18 inside the sensor chip 53. When the crack occurs, there is a problem that the sensor chip 53 malfunctions as moisture intrudes into the sensor chip 53 through the crack and causes corrosion of a wiring and the like. In addition, there occurs a problem that the diaphragm 9 is damaged as the crack extends to the inside of the sensor chip 53. One of reasons that causes the crack to be easily generated in the insulating film 28 is that a film having a tensile stress, such as a silicon nitride film, has a property that is easily expanded and contracted depending on a temperature change.

In regard to this, the coatability of the insulating film 28 is improved in the thermal fluid flow sensor according to the present embodiment by providing the step in the side wall of the concave Portion 5 in which the insulating film 28 is embedded as illustrated in FIG. 3. That is, the concave portion 5 is configured using the concave portions 5a and 5b, each of which as a smaller depth than the concave portion 30 according to the comparative example, and accordingly, the step is formed in the side wall inside the concave portion 5 in the present embodiment. Since each depth of the concave portions covered by the insulating film 28 is smaller than that of the comparative example in the present embodiment, it is possible to improve the coverage of the insulating film 28, which covers the side wall and the bottom face of each of the concave portions 5a and 5b as compared to the comparative example.

Accordingly, it is possible to prevent the decrease of the film thickness of the insulating film 28 in the vicinity of each of the corner at the boundary between the side wall and the bottom face of the concave portion 5a and the corner at the boundary between the side wall and the bottom face of the concave portion 5b. Thus, it is possible to prevent the generation of the void in the insulating film 28 in the vicinity of these corners. In addition, it is possible to prevent the stress concentration of the insulating film 28 at these corners by improving the coverage of the insulating film 28 at the corners on the respective bottom faces of the concave portions 5a and 5b.

Accordingly, it is possible to realize the prevention of generation of the crack caused by the heat-resistant stress in the sensor chip 52 and the improvement of moisture resistance of the sensor chip 52 by improving the coatability of the insulating film 28 and preventing the stress concentration. Accordingly, it is possible to improve reliability of the thermal fluid flow sensor.

<Process of Manufacturing Thermal Fluid Flow Sensor>

Next, a method of manufacturing the thermal fluid flow sensor according to the present embodiment will be described in the order of processes with reference FIGS. 5 to 14. FIGS. 5 to 14 are cross-sectional views during the process of manufacturing the thermal fluid flow sensor according to the present embodiment. FIGS. 5 to 12 illustrates the semiconductor substrate that includes the air flow measurement section 1A and the circuit section 1B similarly to FIG. 3.

Figure 5:
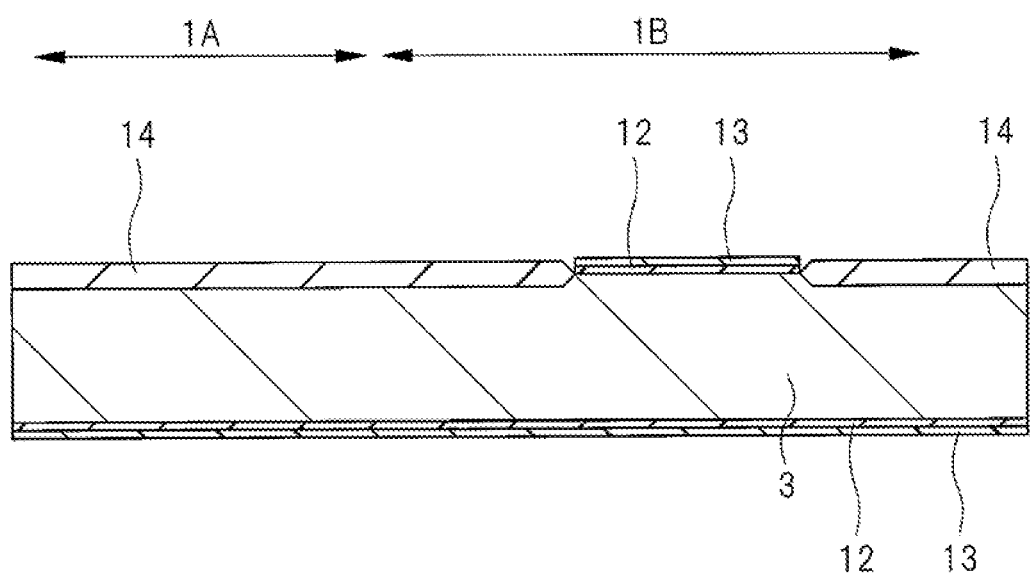
FIG. 5 is a cross-sectional view of a process of manufacturing the thermal fluid flow sensor according to the first embodiment.

First, the semiconductor substrate 3 made of single-crystal Si is prepared as illustrated in FIG. 5. Next, the upper face of the semiconductor substrate 3 is subjected to thermal oxidation treatment using a furnace body at high temperature to form a silicon oxide film 12. Next, a silicon nitride film 13 is formed on the silicon oxide film 12, for example, using a low-pressure thermal CVD (Chemical Vapor Deposition) method. At this time, the silicon oxide film 12 and the silicon nitride film 13 are formed not only on the upper face side of the semiconductor substrate 3 but also on a rear face side thereof.

Next, the silicon nitride film 13 and the silicon oxide film 12 are patterned using a photolithography method and an etching method. Accordingly, a part of the circuit section 1B is removed, and the silicon oxide film 12 and the silicon nitride film 13 are removed. Thereafter, an upper face of the semiconductor substrate 3, exposed in a portion from which the silicon oxide film 12 and the silicon nitride film 13 have been removed by the patterning, is subjected to thermal oxidation at high temperature to form the element isolation region 14 which is made of a thick silicon oxide film for element isolation. The element isolation region 14 is formed to cover the entire surface on the semiconductor substrate 3 in the air flow measurement section 1A, and further, to cover a part of the upper face of the semiconductor substrate 3 in the circuit section 1B. A film thickness of the element isolation region 14 is about 200 to 500 nm and has a compressive stress.

The element isolation region 14 formed herein has, for example, a LOCOS (Local Oxidization of Silicon) structure. However, the element isolation region 14 may have an STI (Shallow Trench Isolation) structure without being limited thereto.

Figure 6:
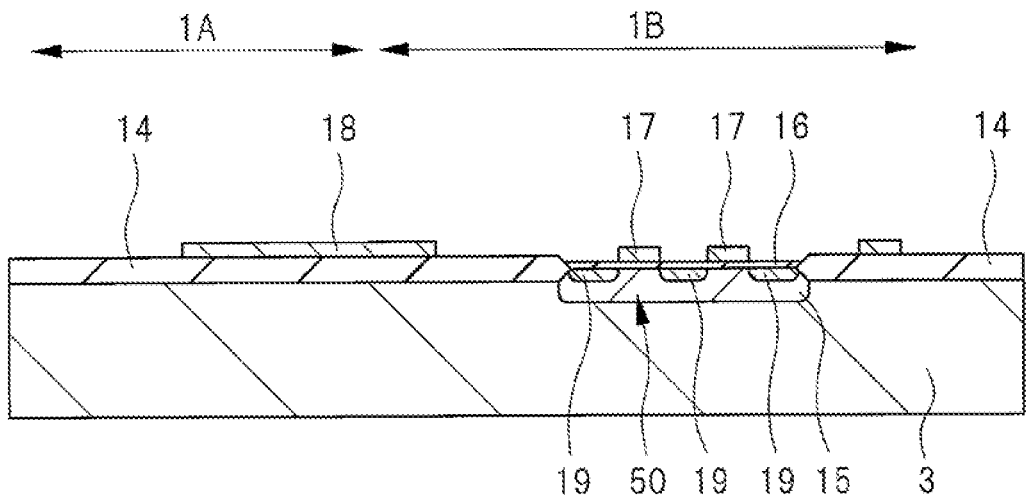
FIG. 6 is a cross-sectional view during the process of manufacturing the thermal fluid flow sensor continuous to FIG.

Next, the silicon oxide film 12 and the silicon nitride film 13 used as a mask for forming the element isolation region 14 are removed, and then, P (phosphorus), B (boron), or As (arsenic) is implanted into the semiconductor substrate 3 exposed from the element isolation region 14 in the circuit section 1B, that is, the semiconductor substrate 3 in the active region using an ion implantation method to form the well 15 as illustrated in FIG. 6. Herein, the P-type well 15, for example is formed by implanting P-type impurities (for example, B (boron)). Thereafter, thermal oxidation treatment is performed to form the gate insulating film 16 made of the silicon oxide film on the main face of the semiconductor substrate 3 in the active region. Next, the polysilicon film is formed on the element isolation region 14 and on the gate insulating film using, for example, a CVD method.

Next, the polysilicon film is patterned using a photolithography method and a dry etching method. The gate electrode 17 made of the polysilicon film is formed on the semiconductor substrate 3 of the circuit section 1B with the gate insulating film 16 interposed therebetween by the patterning. In addition, the heater 18 and the sensor (not illustrated) made of the polysilicon film are formed on the element isolation region 14 of the air flow measurement section 1A by the patterning. Accordingly, the heater 18 and the sensor are made using the same material. A film thickness of the gate insulating film 16 differs depending on characteristics of the circuit to be formed in the circuit section 1B, and is about 5 to 50 nm, for example. Each film thickness of the gate electrode 17, the heater 18, and the sensor is about 100 to 300 nm, for example.

Thereafter, the diffusion layers 19 forming the source and drain regions are formed by implanting P (phosphorus), B (boron), or As (arsenic) into the main face of the semiconductor substrate 3 in the active region of the circuit section 1B using an ion implantation method or the like. Herein, the N-type diffusion layer 19 having a higher impurity concentration than the well 15 is formed by implanting N-type impurities (P (phosphorus) or As (arsenic)), for example. The diffusion layer 19 is formed on the main face of the semiconductor substrate 3 next to the gate electrode 17 in a self-aligned manner. Accordingly, the MOS transistor 50 including the gate electrode 17 and the pair of diffusion layers 19 serving as the source and drain regions is formed.

Incidentally, in the case of forming the MOS transistors 50 having different characteristics according to circuit characteristics, a type of the ion implantation method and an injection amount thereof, a film thickness of the gate insulating film, and a gate electrode material are changed, and transistors in accordance with the respective characteristics are formed by repeating the process of manufacturing the MOS transistor 50.

Figure 7:
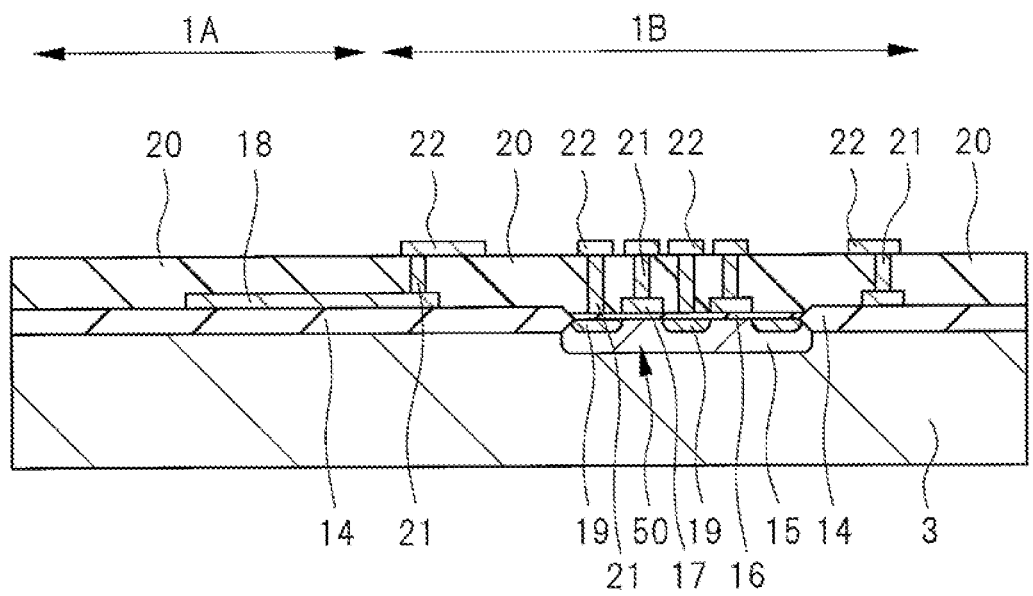
FIG. 7 is a cross-sectional view during the process of manufacturing the thermal fluid flow sensor continuous to FIG. 6.

Next, the interlayer insulating film 20 is formed to be thick on the semiconductor substrate 3 using, for example, a CVD method as illustrated in FIG. 7. The interlayer insulating film 20 has a larger film thickness than the gate electrode 17, the heater 18, and the sensor. Accordingly, the element isolation region 14, the MOS transistor 50, the heater 18, and the sensor (not illustrated) are covered by the interlayer insulating film 20. Next, the flattening of the upper face of the interlayer insulating film 20 is performed using a CMP (Chemical Mechanical Polishing) method or an etchback method. The interlayer insulating film 20 is made of a silicon oxide film containing B (boron) or P (phosphorus), a silicon oxide film using a plasma CVD method, or a silicon oxide film formed using TEOS (Tetra Ethyl Ortho Silicate) as a raw material by a low-temperature CVD method using plasma.

After the above-described flattening process, the plurality of contact holes for connection with the gate electrode 17, the diffusion layer 19, the heater 18, and the sensor in the circuit section 1B, are formed in the interlayer insulating film 20. Thereafter, a titanium nitride (TiN) film formed using a sputtering method or a CVD method, and a tungsten (W) film formed using a CVD method are stacked in this order such that a metal film having a stacked structure of the titanium nitride film and the tungsten film is embedded in the plurality of contact holes. Next, the metal film formed in a region other than the inside of the contact hole is removed using an etchback method or a CMP method to form the plurality of contact plugs 21.

Next, the wiring 22 as a wiring on a first layer is formed. That is, a stacked film of an Al (aluminum) alloy film whose thickness is about 400 to 800 nm, for example, is formed on the interlayer insulating film 20, and then, the Al alloy film is patterned using a photolithography method, a dry etching method or a wet etching method to form the wiring 22.

Incidentally, sputter etching using an Ar (argon) gas may be performed before forming the Al alloy film in order to make contact between the contact plug 21 and the wiring 22 favorable. Further, the wiring 22 may be formed by forming a barrier metal film, such as a TiN film, on the contact plug 21 before forming the Al alloy, forming a stacked film of the barrier metal film and the Al alloy film, and patterning the stacked film, in order to make the contact reliable. Further, the wiring 22 maybe formed by forming a TiN film on the Al alloy film and patterning a stacked film including the Al alloy film and the TiN film on the Al alloy film.

A thickness of the barrier metal film is desirably 200 nm or smaller. In addition, a TiW (titanium tungsten) film, a Ti (titanium) film, or a stacked film thereof may be used although the TiN film has been exemplified as the material of the barrier metal film. Incidentally, the above-described Al alloy film referred herein indicates a film containing Si (silicon) or Cu (copper) at several % or less.

Figure 8:
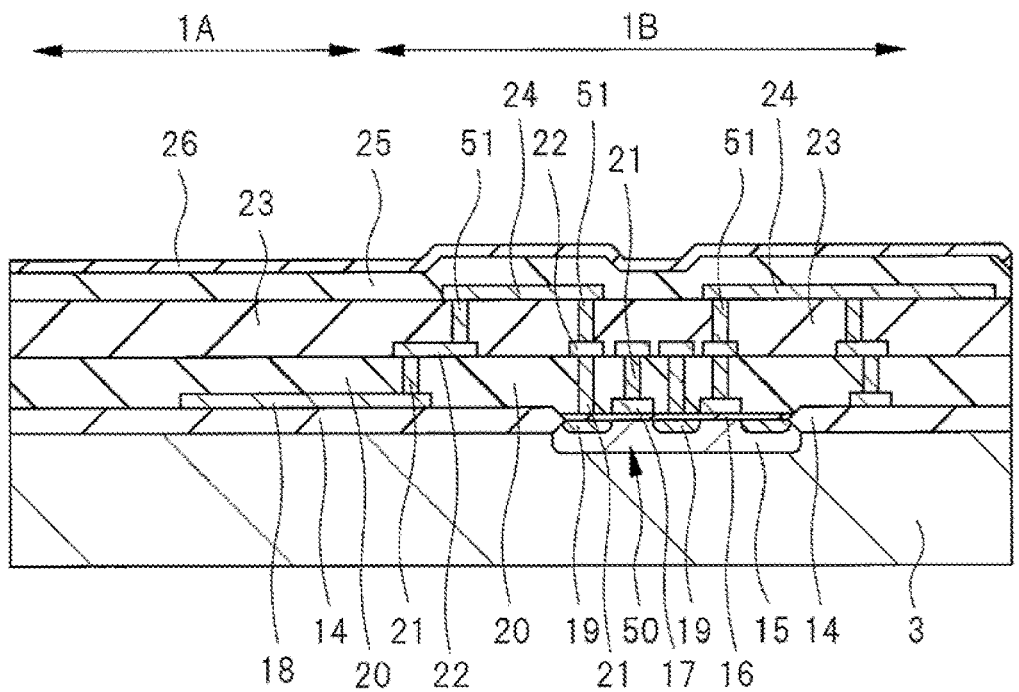
FIG. 8 is a cross-sectional view during the process of manufacturing the thermal fluid flow sensor continuous to FIG. 7.

Next, the interlayer insulating film 23 is formed on the interlayer insulating film 20 and on the wiring 22 such that the wiring 22 is covered by the interlayer insulating film 23 as illustrated in FIG. 8. The interlayer insulating film 23 is made of a silicon oxide film formed, for example, by a CVD method or a low-temperature CVD method using TEOS as a raw material and using plasma. A film thickness of the interlayer insulating film 23 is about, for example, 500 to 1000 nm.

Next, the plurality of contact holes (connection holes) that penetrate through the interlayer insulating film 23 are formed using a photolithography method, a dry etching method or a wet etching method, and then, the contact plug 51 is formed at the inner side of each of the plurality of contact holes on the wiring 22 similarly to the above-described contact plug 21.

Next, the plurality of wirings 24, as wirings on a second layer to be used for electrical connection between the circuit of the circuit section 1B and the heater 18 or the sensor of the air flow measurement section 1A or electrical connection between a sensor chip to be formed later and the outside, are formed. The wiring 24 is made of a stacked film of an Al alloy film whose film thickness is about, for example, 400 to 1000 nm. Incidentally, the wiring 24 is formed using the same method as the wiring 22. The contact plugs 21 and 51 and the wirings 22 and 24 are formed in the circuit section 1B, and are not formed in the air flow measurement section 1A.

Next, the wiring 24 is covered using the insulating film 25 by forming the insulating film 25 on the interlayer insulating film 23 and on the wiring 24. The insulating film 25 is made of a silicon oxide film formed, for example, by a CVD method or a low-temperature CVD method using TEOS as a raw material and using plasma. A film thickness of the insulating film 25 is about, for example, 300 to 1000 nm.

Next, the protective film 26 is formed on the insulating film 25. The protective film 26 is made of a plasma silicon nitride film, formed by a low-temperature CVD method using plasma, for example, and has the compressive stress. The protective film 26 is formed to have a film thickness of about 600 to 1000 nm in order to suppress the damage to the transistor caused by filler at the time of molding with the mold resin in the subsequent process and to the wiring caused by a thermal stress of the mold resin, and to prevent the corrosion of the wiring caused the transmission of moisture from the outside. Incidentally, the upper face of the insulating film 25 may be flattened using a CMP method after forming the insulating film 25. When the flattening is performed in this manner, unevenness is hardly generated in the protective film 26 formed on the insulating film 25, and thus, mechanical strength of the protective film 26 increases. Incidentally, powder containing silicon oxide is used as the filler.

Figure 9:
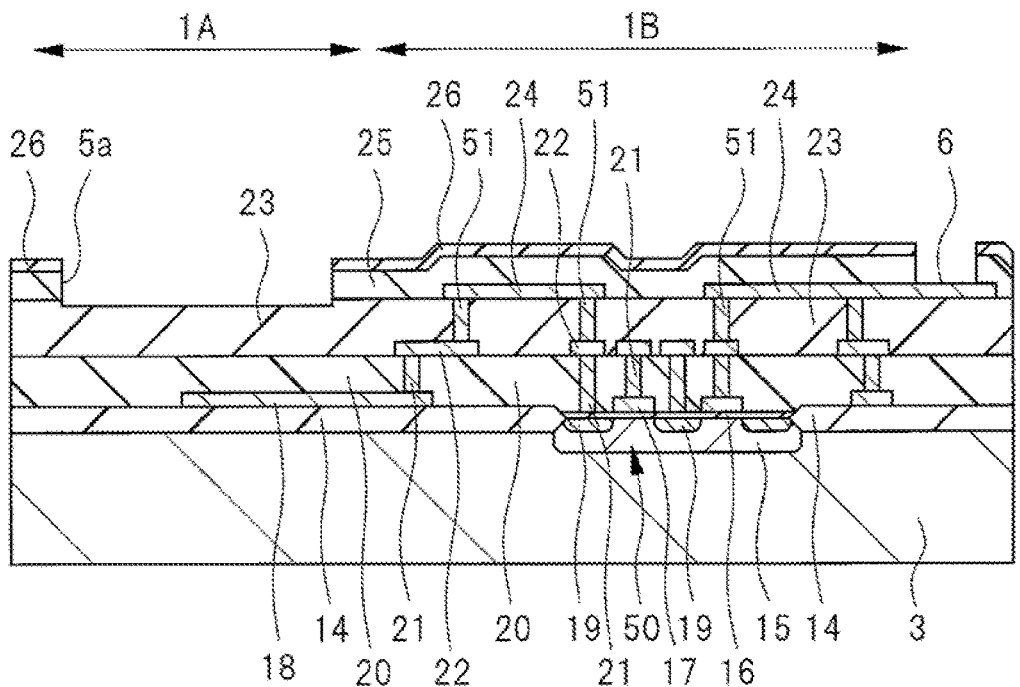
FIG. 9 is a cross-sectional view during the process of manufacturing the thermal fluid flow sensor continuous to FIG. 8.

Next, patterning is performed using a photolithography method and a dry etching method to open a part of a stacked film of the protective film 26 and the insulating film 25 as illustrated in FIG. 9. Accordingly, a part of the upper face of the wiring 24 is exposed. The wiring 24 in the portion exposed by the patterning process is used as the electrode pad 6 for connection with the outside of the sensor chip 52. In the patterning process, the insulating film 25 and the protective film 26, which have the compressive stress, are also opened in the air flow measurement section 1A including the diaphragm 9 using dry etching. Accordingly, the concave portion 5a as a first step is formed in an upper face of a stacked film including the insulating film 25 and the protective film 26 of the air flow measurement section 1A. Herein, the bottom face of the concave portion 5a reaches the middle depth of the interlayer insulating film 23. However, the depth of the concave portion 5a may reach the middle depth of the insulating film 25.

Figure 10:
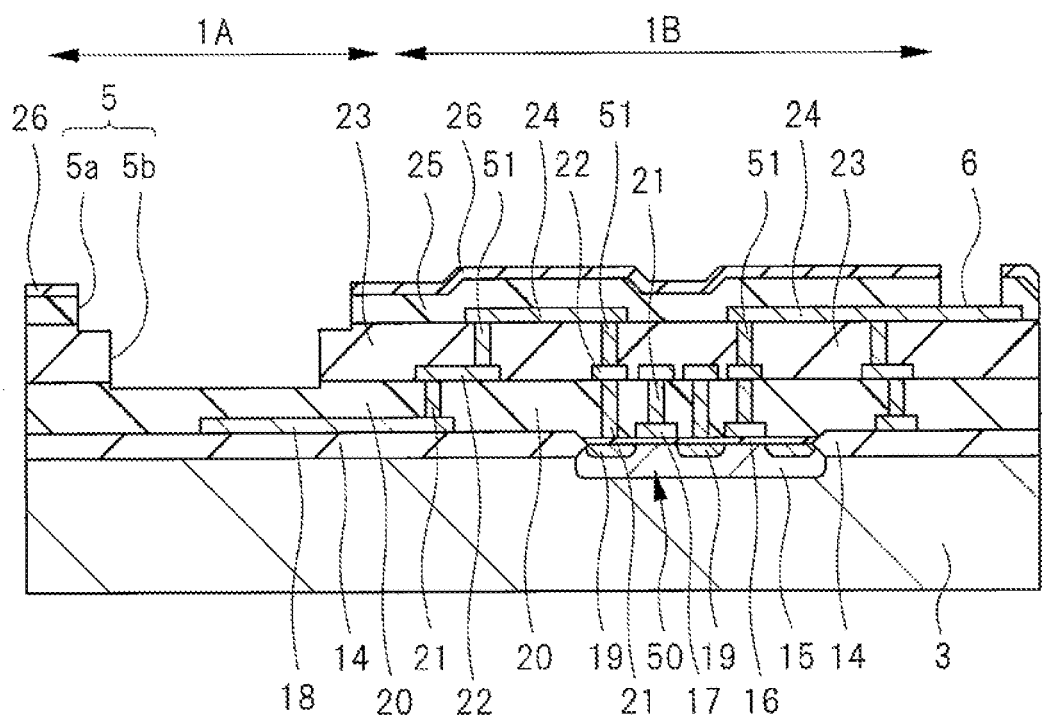
FIG. 10 is a cross-sectional view during the process of manufacturing the thermal fluid flow sensor continuous to FIG. 9.

Next, the interlayer insulating film 23, which is a part of the bottom face of the concave portion 5a formed in the air flow measurement section 1A, is opened using a photolithography method and a dry etching method to form the concave portion 5b as a second step as illustrated in FIG. 10. Accordingly, the concave portion 5 which serves as the concave portion including the concave portions 5a and 5b and which has stair-like steps on the side wall thereof is formed. Herein, the bottom face of the concave portion 5b reaches the middle depth of the interlayer insulating film 20. However, the depth of the concave portion 5b may reach the middle depth of the interlayer insulating film 23. The bottom face of the concave portion 5b, that is, the bottom face of the concave portion 5 does not reach each upper face of the heater 18 and the sensor (not illustrated).

Figure 11:
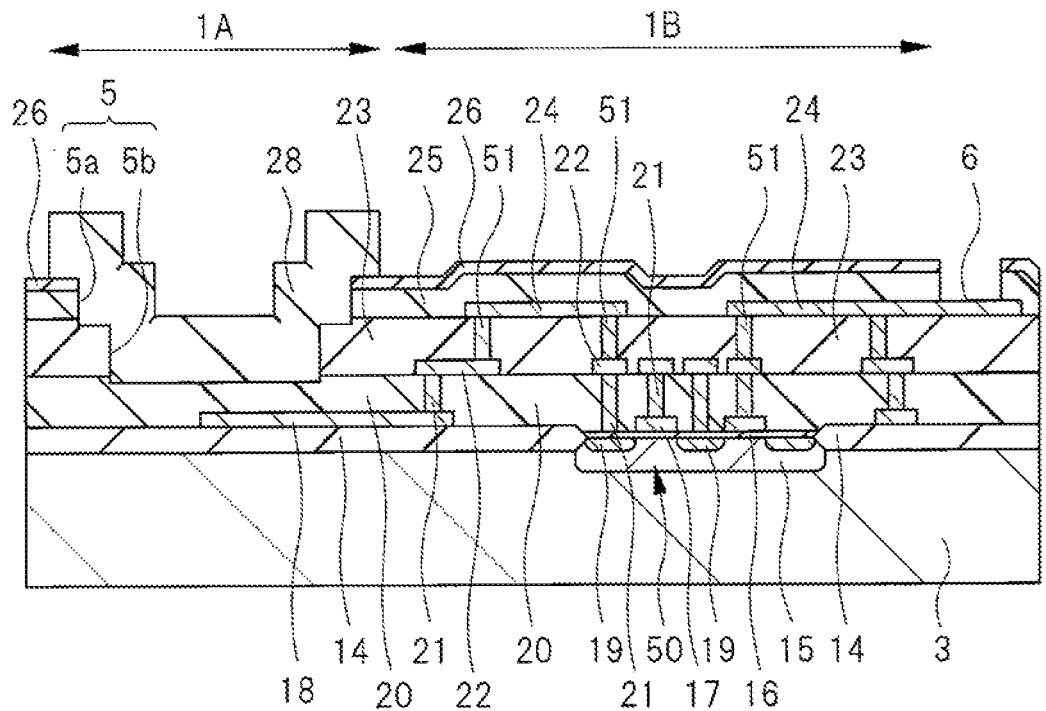
FIG. 11 is a cross-sectional view during the process of manufacturing the thermal fluid flow sensor continuous to FIG. 10.

Next, the insulating film 28, which is formed on a stacked insulating film including the interlayer insulating films 20 and 23, the insulating film 25, and the protective film 26 in the air flow measurement section 1A and covers the side wall and the bottom face in the concave portion 5, is formed as illustrated in FIG. 11. The insulating film 28 is made of the silicon nitride film formed by a low-temperature CVD method using plasma, for example, and has a tensile stress of 150 MPa. The insulating film 28 is formed to have a film thickness of 800 to 2000 nm so as to make the stress of the diaphragm to be formed in the air flow measurement section 1A in the subsequent process the tensile stress. Next, the insulating film 28 is patterned using a photolithography method and an etching method to form a pattern that exposes the stacked insulating film in the circuit section 1B and covers the stacked insulating film in the air flow measurement section 1A.

In the above-described patterning process, the insulating film 28 is caused to remain in a region overlapping the diaphragm, which will be described later, when seen in a plan view. In addition, the insulating film 28 is caused to remain so as to have a larger area than the diaphragm when seen in a plan view. However, characteristics of the semiconductor element such as the MOS transistor 50 are changed when being formed in the region having tensile stress. In order to prevent such a change in characteristics, the insulating film 28 in the circuit section 1B including the element such as the MOS transistor 50 is removed in the above-described patterning process.

The insulating film 28 is formed along the side wall and the bottom face of the underlying concave portion 5. That is, the insulating film 28 is formed along the side wall of the concave portion 5a, the bottom face of the concave portion 5a, the side wall of the concave portion 5b, and the bottom face of the concave portion 5b. Thus, the insulating film 28 is formed like the stair along the side wall of the concave portion 5. In addition, the concave portion is formed in the upper face of the insulating film 28, and the step is formed in the side wall of the concave portion. Herein, insulating film 28 is formed to have a larger film thickness than any depth of the concave portions 5a and 5b. Each depth of the concave portions 5a and 5b is desirably 1.5 µm or smaller in the case of considering the coatability of the insulating film 28, and the depth of the concave portion 5 is about 3 µm.

Figure 12:
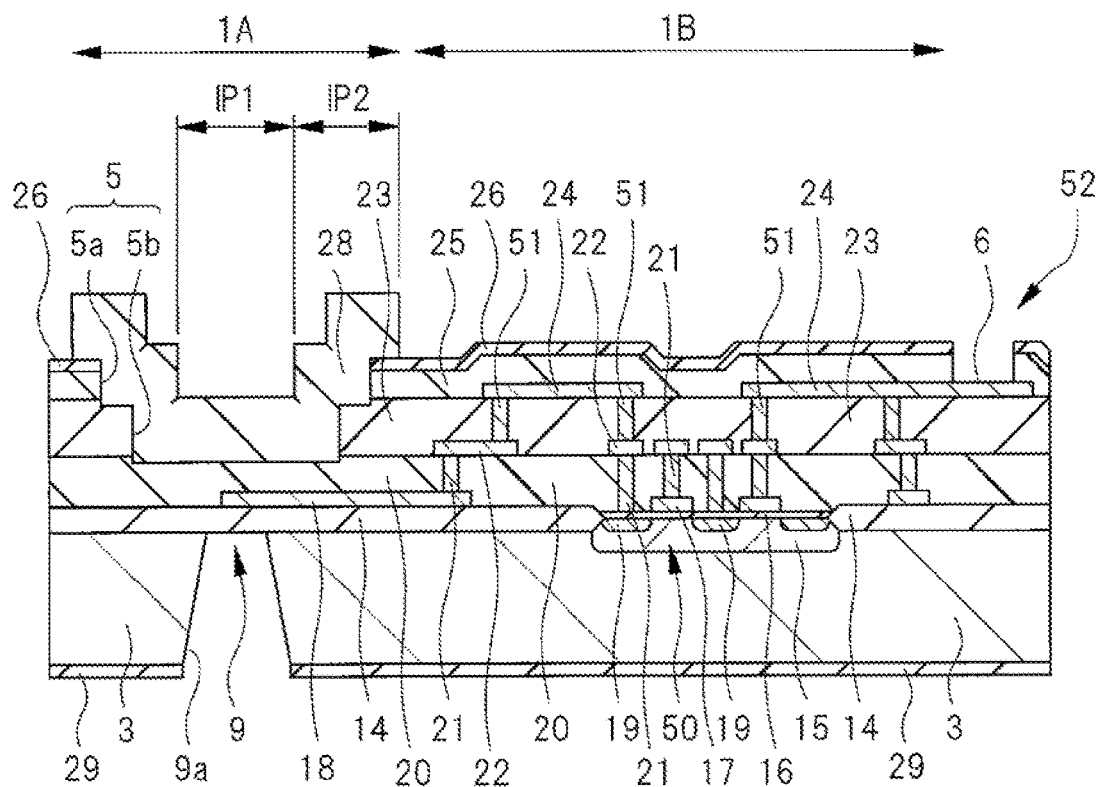
FIG. 12 is a cross-sectional view during the process of manufacturing the thermal fluid flow sensor continuous to FIG. 11.

Next, the insulating film 29 that covers the rear face of the semiconductor substrate 3 on the opposite side of the main face is formed as illustrated in FIG. 12. The insulating film 29 is made of a silicon oxide film formed, for example, by a low-temperature CVD method using TEOS as a raw material and using plasma or a silicon nitride film formed by a low-temperature CVD method using plasma. Thereafter, a resist pattern is formed using a photolithography method, and dry etching or wet etching is performed using the resist pattern as a mask to remove a part of the insulating film 29 in the air flow measurement section 1A. Accordingly, a part of the rear face of the semiconductor substrate 3 in the air flow measurement section 1A is exposed. In this etching process, the insulating film 29 immediately below the bottom face of the concave portion 5b is removed.

Next, wet etching is performed using the remaining insulating film 29 as a mask to remove a part of the semiconductor substrate 3, and accordingly, the hole 9a penetrating through the semiconductor substrate 3 is formed. Accordingly, the diaphragm 9 is formed in the air flow measurement section 1A. This wet etching is performed using KOH (potassium hydroxide) or TMAH (tetramethylammonium hydroxide) or an aqueous solution which has KOH (potassium hydroxide) and TMAH (tetramethylammonium hydroxide) as the main components as a chemical solution The sensor chip 52, which includes semiconductor substrate 3 including opening on the rear face thereof in the air flow measurement section 1A, the circuit including the MOS transistor 50 and the like, the heater 18 and the sensor (not illustrated), the concave portion 5 formed in the stacked insulating film immediately above the heater 18 and the sensor (not illustrated), and the insulating film 28 that covers the concave portion s, is formed through the above-described processes.

The area of the lower face of the element isolation region 14 exposed inside the hole 9a is smaller than at least the area of insulating film 28 when seen in a plan view. The insulating film 29 may be formed using a stacked film of a silicon oxide film and a silicon nitride film. In addition, the process of forming the insulating film 29 may be omitted in a case where a film, which is capable of sufficiently withstanding the KOH solution and the like is left on the rear face of the semiconductor substrate 3 in a step when the above-described patterning, performed to form the insulating film 28, is ended. In addition, an opening width of the hole 9a is larger on the rear face side of the semiconductor substrate 3 than on the main face side of the semiconductor substrate 3 when the hole 9a is formed using the wet etching. In addition, a dry etching method may be used in the process of forming the hole 9a.

Herein, the description has been given regarding the case of forming the heater 18 and the sensor using the same polysilicon film as the gate electrode 17. In regard to this, the heater 18 and the sensor may be formed using a different film from the gate electrode 17. At this time, the heater 18 and the sensor and the gate electrode 17 may be formed on layers having different heights.

A metal film containing α-Ta (alpha-tantalum), Ti (titanium), W (tungsten), Co (cobalt), Ni (nickel), Fe (iron), Nb (niobium), Hf (hafnium), Cr (chromium), or Zr (zirconium), as the main component, can be used as a material of the heater 18 and the sensor. In addition, a metal nitride compound such as TaN (tantalum nitride), MoN (molybdenum nitride), and WN (tungsten nitride) can be used as the material of the heater 18 and the sensor. In addition, a metal silicide compound such as MoSi (molybdenum silicide), CoSi (cobalt silicide) and NiSi (nickel silicide) can be used as the material of the heater 18 and the sensor.

In addition, conductive films, made of various types of materials described above, may be successively formed and stacked to form the heater 18 and the sensor that are formed using the stacked film. In addition, the heater 18 and the sensor having a multilayer structure may be formed by arranging a plurality of conductive films, made of various types of materials described above, to be separated with heights different from each other and connecting the conductive films via the contact plug.

Herein, the description has been given regarding the case of forming two wiring layers including the wirings 22 and 24, but the number of stacked wirings may be three or more. In the case of forming three or more wiring layers, steps of the side wall of the concave Portion 5 may be increased by increasing the number of concave portions forming the concave portion 5. At this time, it is configured such that a depth of each concave portion forming the concave portion 5 does not exceed 1.5 µm.

Herein, a face of the upper face of the insulating film 28 that is at a lowest position, that is, the bottom face of the concave portion formed in the upper face of the insulating film 28 has a width IP1 in the direction along the main face of the semiconductor substrate 3. In addition, a shortest distance from an end of the bottom face to a terminal end of the insulating film 28 on the protective film 26 has a width IP2 in the direction along the main face of the semiconductor substrate 3. Herein, the width IP1 is larger than the width IP2.

This is because there is a risk that the sensor chip 52 is damaged because the tensile stress in the vicinity of the diaphragm 9 excessively increases when the width of the insulating film 28 next to the diaphragm 9 is larger than the width of the insulating film 28 immediately above the diaphragm 9. Accordingly, herein, the width of the insulating film 28 in the region next to the diaphragm 9 is set to be small.

Figure 13:
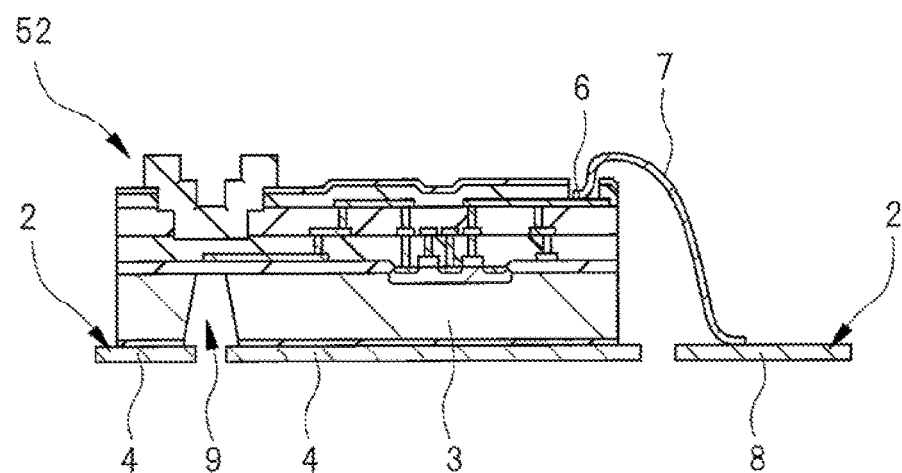
FIG. 13 is a cross-sectional view during the process of manufacturing the thermal fluid flow sensor continuous to FIG. 12.

Next, the sensor chip 52 illustrated in FIG. 12 is mounted and fixed to an upper face of the substrate mounting portion 4 as the lead frame 2, and wire bonding is performed to connect the external terminal 8 as the lead frame 2 and the electrode pad 6 of the sensor chip 52 as illustrated in FIG. 13. Accordingly, the sensor chip 52 and the external terminal 8 are electrically connected to each other via the bonding wire 7. The substrate mounting portion 4 as the lead frame 2 is opened at a position immediately below the diaphragm 9.

Figure 14:
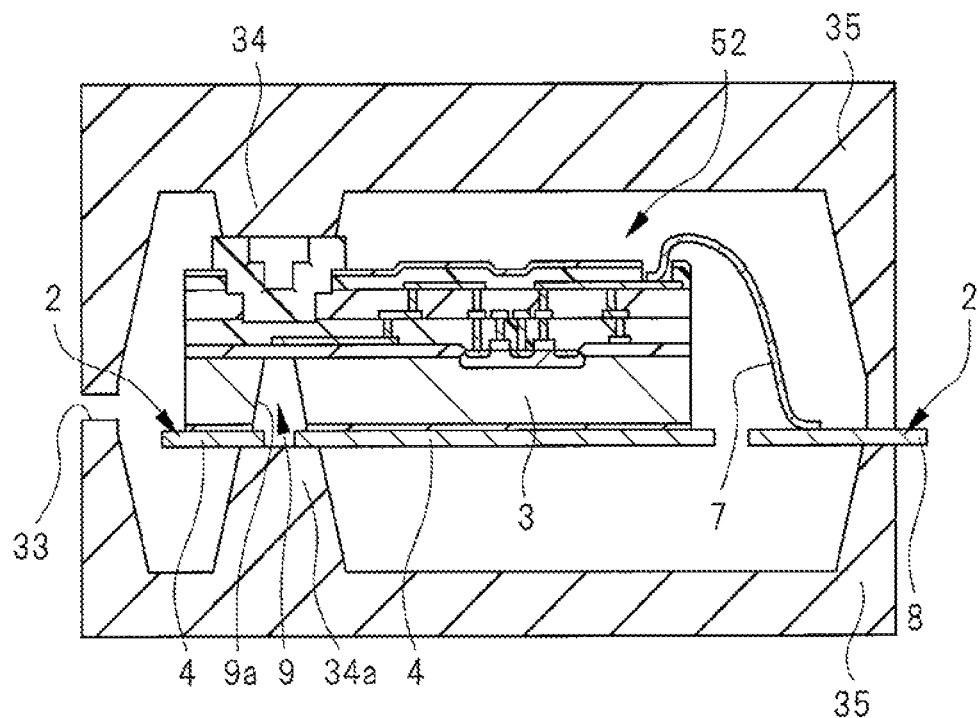
FIG. 14 is a cross-sectional view during the process of manufacturing the thermal fluid flow sensor continuous to FIG. 13.

Next, the lead frame 2 to which the sensor chip 52 is mounted is arranged inside a mold 35 for molding, and the mold is filled with resin (not illustrated) through a mold resin inlet 33 as illustrated in FIG. 14. At this time, a groove is formed in the mold resin in the air flow measurement section such that the mold resin to be formed does not disturb the flow of air in the air flow measurement section. Thus, a convex portion for an air flow path 34, which is a part of the mold 35 positioned above the sensor chip 52 and formed at a position opposing the insulating film 28, is brought into contact with the sensor chip 52 such that the mold resin does not flow into the concave portion in the upper face of the insulating film 28.

In particular, it is difficult to perform the measurement of the flow rate normally when the mold resin adheres to the upper face of the diaphragm 9, that is, the bottom face of the above-described concave portion of the insulating film 28, and thus, intrusion of the mold resin into the concave portion is prevented by bringing an uppermost face of the insulating film 28 next to the concave portion into contact with the bottom face of the convex portion for the air flow path 34. In addition, there is a risk that the diaphragm 9 is damaged when the insulating film 28 immediately above the diaphragm 9 is brought into direct contact with the convex portion for the air flow path 34, and thus, the concave portion 5 obtained by removing the interlayer insulating film 23 and the insulating film 25 having the compressive stress is formed so as to be also used for the stress adjustment of the diaphragm 9. Accordingly, the direct contact between the insulating film 28 below the above-described concave portion and the convex portion for the air flow path 34 is prevented. In addition, the interlayer insulating film 20 may be further removed from a bottom of the concave portion 5 such that the stress acting on the diaphragm 9 does not become the tensile stress.

Accordingly, the convex portion for the air flow path 34 is not in contact with the side wall and the bottom face of the concave portion in the upper face of the insulating film 28. That insulating film 28 is in contact with the convex portion for the air flow path 34 at an outer side of the diaphragm 9. In addition, it is important to stack an end portion of the insulating film 28 and the protective film 26 below a contact point between the convex portion for the air flow path 34 and the sensor chip 52 in order to prevent the corrosion of the wirings 22 and 24 caused by moisture absorption even when the push of the convex portion for the air flow path 34 is strong and the crack occurs in the insulating film 28.

In addition, a convex portion 34a, which is a part of the mold 35, is also provided below the convex portion for the air flow path in order to reliably obtain the close contact between the insulating film 28 and the convex portion for the air flow path 34. That is, the convex portion 34a protruding to the sensor chip 52 side is provided in the mold 35 on the rear face side of the sensor chip 52, and an upper face of the convex portion 34a is in contact with a rear face of the substrate mounting portion 4 as the lead frame 2. The upper face of the convex portion 34a blocks the opening of the substrate mounting portion 4 below the hole 9a. Thus, the mold resin does not flow into the hole 9a.

Next, the thermal fluid flow sensor 1 including the fixed mold resin 10 and the sensor chip 52 is taken out of the mold 35 after the above-described process of filling the mold resin (see FIG. 2). Accordingly, the thermal fluid flow sensor 1 (see FIG. 2), which is the thermal fluid flow sensor according to the present embodiment, is formed. The thermal fluid flow sensor 1 is used in the state of being attached to the intake passage of the internal combustion engine such as the automobile as described with reference to FIG. 4.

<Effect of Method of Manufacturing Thermal Fluid Flow Sensor According to The Present Embodiment>

The method of manufacturing the thermal fluid flow sensor according to the present embodiment has the same effects as the effects described above with reference to FIGS. 3 and 30.

That is, the insulating film 28 having the tensile stress is not formed but the protective film 26 having the compressing stress is formed in the circuit section 1B, as illustrated in FIG. 12, so as to realize the protection of the wirings 22 and 24 and the improvement of moisture resistance while preventing the characteristic change of the element such as the MOS transistor 50.

In addition, the coatability of the insulating film 28 is improved in the present embodiment by providing the step in the side wall of the concave portion 5 in which the insulating film 28 is embedded as illustrated in FIG. 12. Herein, the concave portion 5 including the concave portions 5a and 5b is formed as described with reference to FIGS. 9 and 10, and accordingly, the step is formed in the side wall inside the concave portion 5. That is, the concave portion 5 including the stair-like steps in the side wall thereof is formed by performing a plurality of opening processes.

Accordingly, it is possible to prevent the generation of the void at each corner of the concave portions 5a and 5b by decreasing each depth of the concave portions covered by the insulating film 28. In addition, it is possible to prevent the stress concentration of the insulating film 28 at these corners by improving the coverage of the insulating film 28 at the corners on the respective bottom faces of the concave portions 5a and 5b. Accordingly, it is possible to realize the prevention of generation of the crack caused by the heat-resistant stress in the sensor chip 52 and the improvement of moisture resistance of the sensor chip 52. Accordingly, it is possible to improve the reliability of the thermal fluid flow sensor which includes the flow detection section and the control circuit section on the same substrate.

(Second Embodiment)

A thermal fluid flow sensor according to the present embodiment is different from the one according to the above-described first embodiment in terms that a metal film on the same layer as an Al wiring is used as a stopper at the time of forming a concave portion in an upper face of a stacked insulating film in an air flow measurement section.

Hereinafter, a method of manufacturing the thermal fluid flow sensor according to the present embodiment will be described with reference to FIGS. 15 to 20. FIGS. 15 to 20 are cross-sectional views during the process of manufacturing the thermal fluid flow sensor according to the present embodiment. The semiconductor substrate 3 illustrated in FIGS. 15 to 20 includes the air flow measurement section 1A and the circuit section 1B which are arrayed side by side in the direction along the main face of the semiconductor substrate 3, which is similar to FIGS. 5 to 12.

Figure 15:
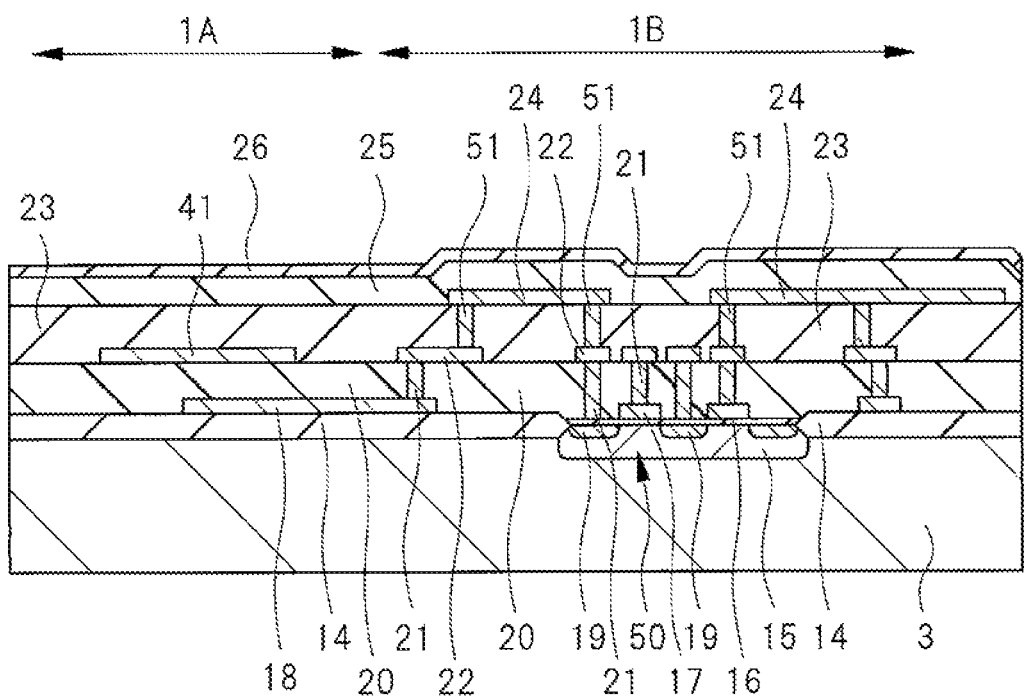
FIG. 15 is a cross-sectional view of a process of manufacturing a thermal fluid flow sensor according to a second embodiment.

First, substantially processes the same as the processes that have been described with reference to FIGS. 5 to 8 are performed to form the element isolation region 14, the heater 18, the sensor (not illustrated), the MOS transistor 50, the wirings 22 and 24, the interlayer insulating films 20 and 23, the insulating film 25, the protective film 26, and the like on the semiconductor substrate 3 as illustrated in FIG. 15. Herein, however, a stopper film 41 made of a metal film is formed in the process of forming the wiring 22, which has been described with reference to FIG. 7, by processing the metal film of the element isolation region 14 at the time of forming the wiring 22 by processing the metal film on the interlayer insulating film 20, which is different from the above-described first embodiment.

Thereafter, the interlayer insulating film 23, the contact plug 51, the wiring 24, the insulating film 25, and the protective film 26 are formed similarly to the above-described first embodiment. Accordingly, the stopper film 41 covered by the interlayer insulating film 23, the insulating film 25, and the protective film 26 remains on the interlayer insulating film 20 of the air flow measurement section 1A. The stopper film 41 is formed immediately above each of the heater 18 and the sensor.

Figure 16:
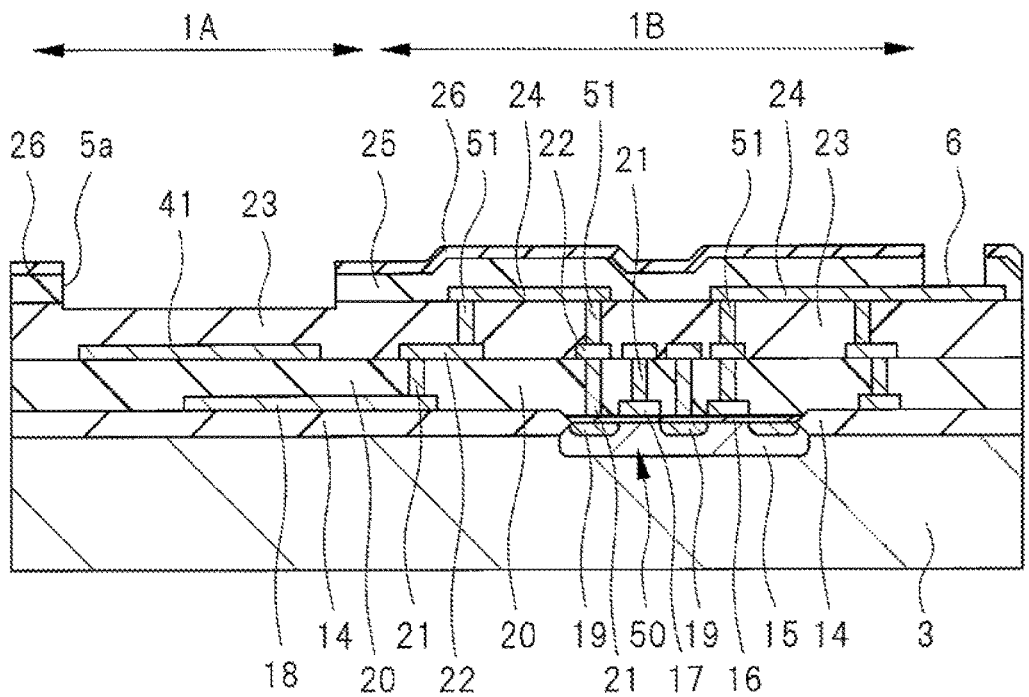
FIG. 16 is a cross-sectional view during the process of manufacturing the thermal fluid flow sensor continuous to FIG. 15.

Next, the concave portion 5a is formed in the upper face of the stacked insulating film including the interlayer insulating film 23, the insulating film 25, and the protective film 26 in the air flow measurement section 1A as illustrated in FIG. 16 in the same manner as in the process that has been described with reference to FIG. 9. Herein, the concave portion 5a is formed immediately above the stopper film 41. In addition, the electrode pad 6 is exposed from the insulating film 25 and the protective film 26, herein.

Figure 17:
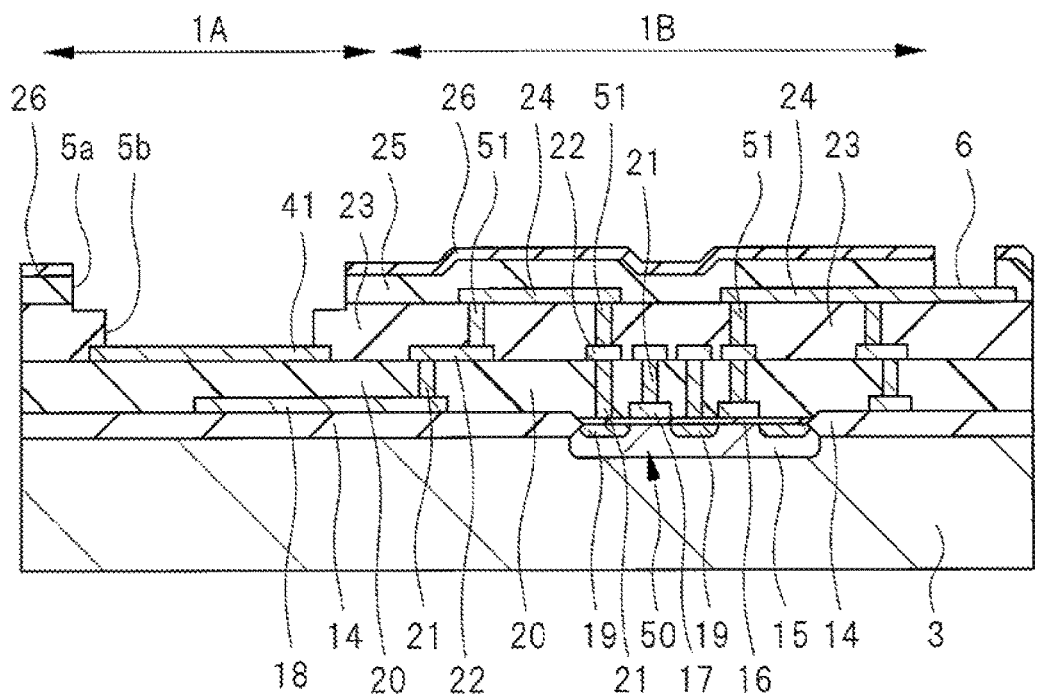
FIG. 17 is a cross-sectional view during the process of manufacturing the thermal fluid flow sensor continuous to FIG. 16.

Next, the concave portion 5b is formed in the bottom face of the concave portion 5a as illustrated in FIG. 17 by performing a process the same as the process that has been described with reference to FIG. 10. However, the dry etching to form the concave portion 5b is stopped at an upper face of the stopper film 41. That is, the stopper film 41 has a tolerance with respect to a reaction gas used in the dry etching to remove apart of the interlayer insulating film 23. In other words, the stopper film 41 has a high processing selection ratio relative to the reaction gas to remove a part of the interlayer insulating film 23. Accordingly, the stopper film 41 is not removed, and thus, it is possible to prevent eh concave portion 5b from being excessively deepened due to over etching.

Incidentally, the stopper film 41 may be formed at a layer having a different height. For example, when a film thickness from the upper face of the sensor to the upper face of the interlayer insulating film 23 is small, the stopper film made of the metal film on the same layer as the wiring 24 may be formed on the interlayer insulating film 23.

Figure 18:
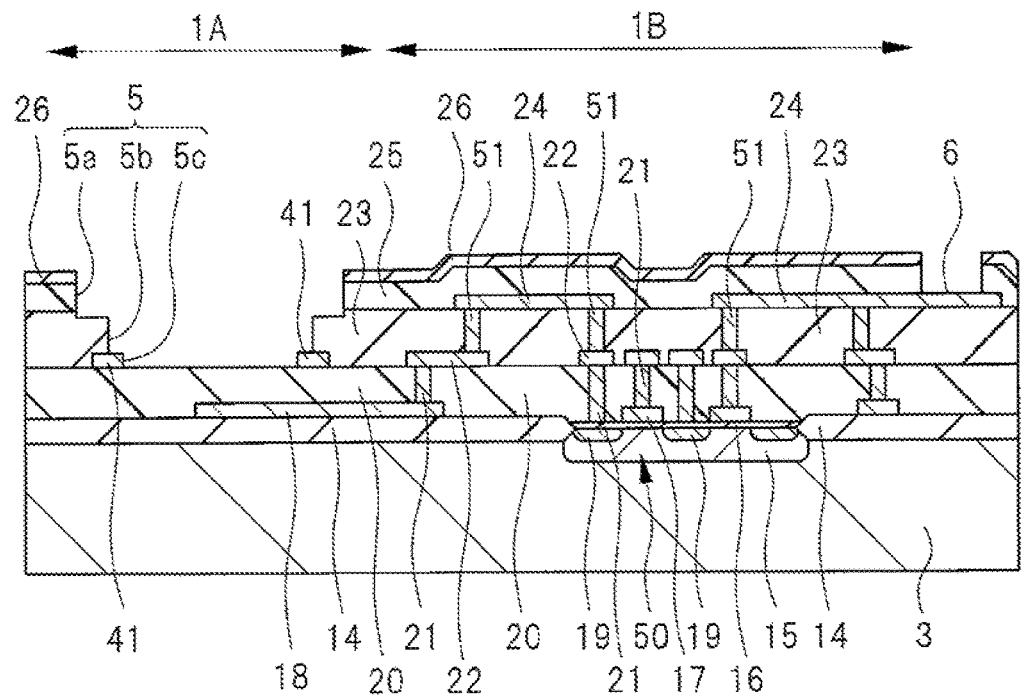
FIG. 18 is a cross-sectional view during the process of manufacturing the thermal fluid flow sensor continuous to FIG. 17.

Next, apart of the stopper film 41 exposed in the bottom face of the concave portion 5b is removed using a photolithography method and a dry etching method to form a concave portion 5c penetrating through the stopper film 41 as illustrated in FIG. 18. Accordingly, a part of the upper face of the interlayer insulating film 20 is exposed from the stopper film 41.

The concave portion 5c has smaller opening area and opening width than the concave portion 5b when seen in a plan view, and the side wall of the concave portion 5b and a side wall of the concave portion 5c do not overlap each other when seen in a plan view. That is, the concave portion 5c is formed at an inner side of the concave portion 5b when seen in a plan view. Each bottom face of the concave portions 5a and 5b has an annular shape when seen in a plan view.

The concave portions 5a, 5b and 5c form the concave portion 5. An upper face of an end and a side wall of the stopper film 41 are exposed inside the concave portion 5. That is, steps, more than those of the above-described first embodiment by one step, are formed in the side wall of the concave portion 5. Accordingly, when the depth of the concave portion 5 is the same between the present embodiment and the above-described first embodiment, it is possible to set the depth of each of the concave portions forming the concave portion 5 in the present embodiment to be smaller than that of the above-described first embodiment. Herein, two steps of a step formed using the bottom face of the concave portion 5a and the side wall of the concave portion 5b and a step formed using the bottom face of the concave portion 5b and the side wall of the concave portion 5c formed inside the concave portion 5.

Figure 19:
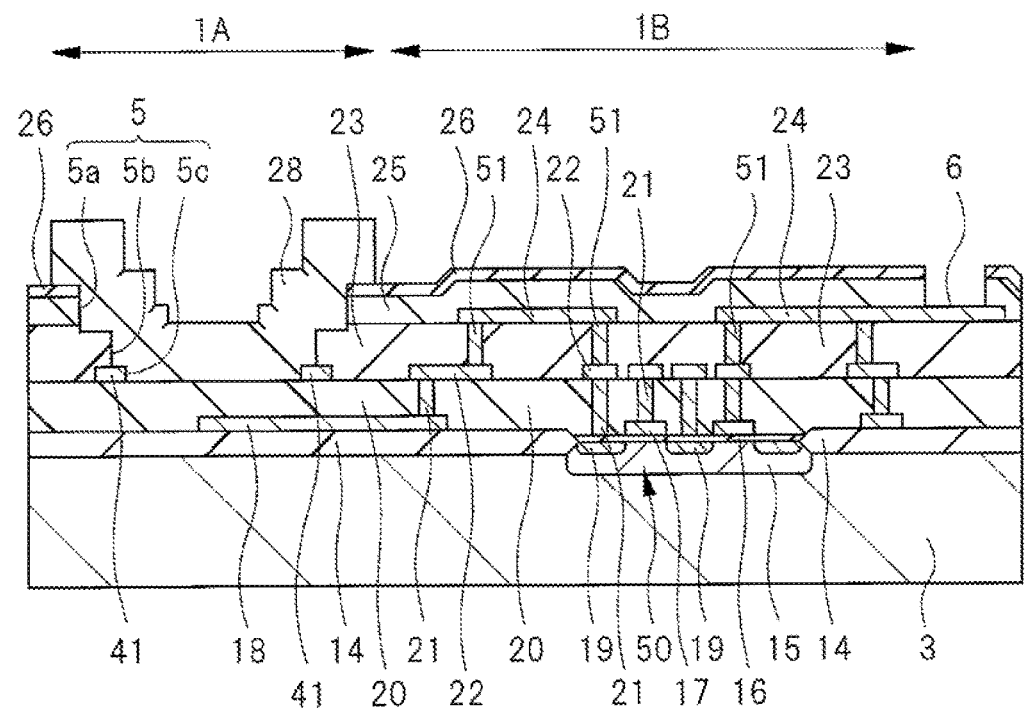
FIG. 19 is a cross-sectional view during the process of manufacturing the thermal fluid flow sensor continuous to FIG. 18.

Next, the insulating film 28 having the tensile stress is formed in the air flow measurement section 1A by performing process the same as the process that has been described with reference to FIG. 11 as illustrated in FIG. 19. A part of the insulating film 28 is formed to cover the upper face of the stopper film 41, which is the bottom face of the concave portion 5b, and the side wall of the stopper film 41 which is the side wall of the concave portion 5c. Since there are more stair-like steps inside the concave portion 5 in the present embodiment than the above-described first embodiment, it is possible to reduce the depth of each of the concave portions forming the concave portion 5. Thus, the coverage of the insulating film 28 embedded in the respective concave portions is improved, and thus, it is possible to prevent the generation of the void and the generation of the stress concentration. Accordingly, it is possible to further enhance the coatability of the insulating film 28, and thus, it is possible to form the sensor chip having the high tolerance with respect to the thermal stress and the high moisture-proof property.

Similarly to the above-described first embodiment, the film thickness of the insulating film 28 formed inside the concave portion 5 is larger than any depth of each of the concave portions 5a, 5b and 5c forming the concave portion 5. That is, the film thickness of the insulating film 28 formed inside the concave portion 5 is larger than any height of the plurality of steps formed in the side wall of the concave portion 5.

Next, the insulating film 29 and the hole 9a are formed as illustrated in FIG. 20 by performing a process the same as the process that has been described with reference to FIG. 12. Accordingly, the sensor chip 52 including the diaphragm 9 is formed. It is possible to form the thermal fluid flow sensor according to the present embodiment in the subsequent processes by performing processes the same as the processes that have been described with reference to FIGS. 13 and 14.

The stopper film 41 is used as an etching stopper film in the present embodiment, and thus, it is possible to prevent generation of a processing deviation caused by etching in the process of forming the concave portion 5b that has been described with reference to FIG. 17. Accordingly, it is possible to accurately perform the stress adjustment of the diaphragm 9. In addition, it is possible to form the sensor chip having the high tolerance with respect to the thermal stress and the high moisture-proof property by increasing the stair-like steps inside the concave portion 5 as described above, and thus, it is possible to improve the reliability of the thermal fluid flow sensor.

(Third Embodiment)

A thermal fluid flow sensor according to the present embodiment is different from the one according to the second embodiment in terms that an inclination is provided in a side wall of a concave portion of a stacked insulating film in an air flow measurement section, and an insulating film for stress adjustment to be formed along the side wall is formed to have a uniform film thickness.

Figure 22:
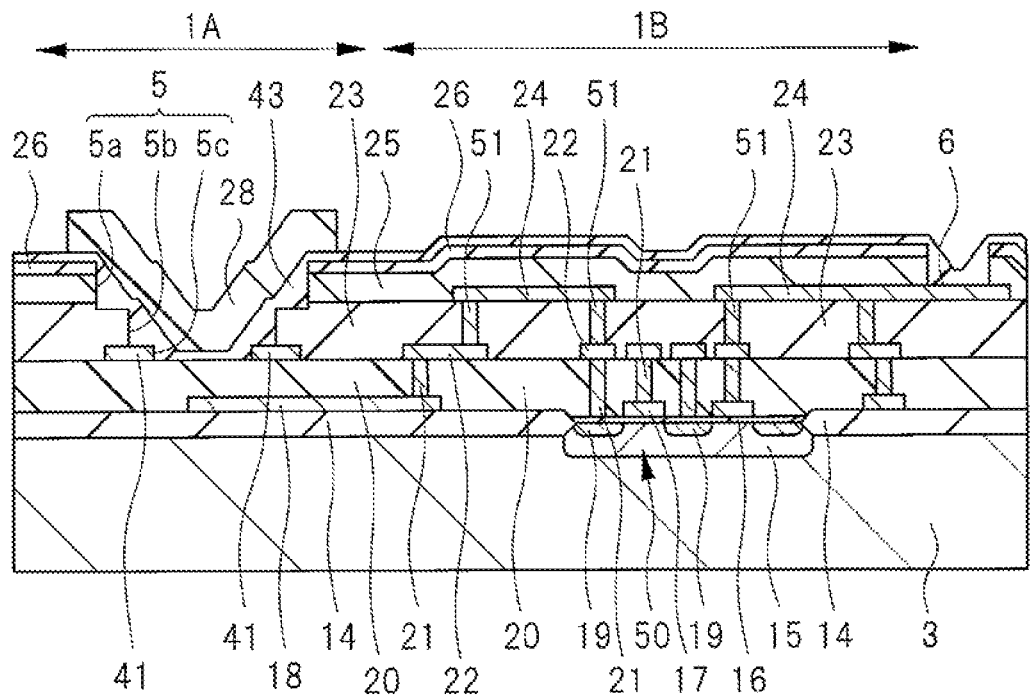
FIG. 22 is a cross-sectional view during the process of manufacturing the thermal fluid flow sensor continuous to FIG. 21.
Figure 23:
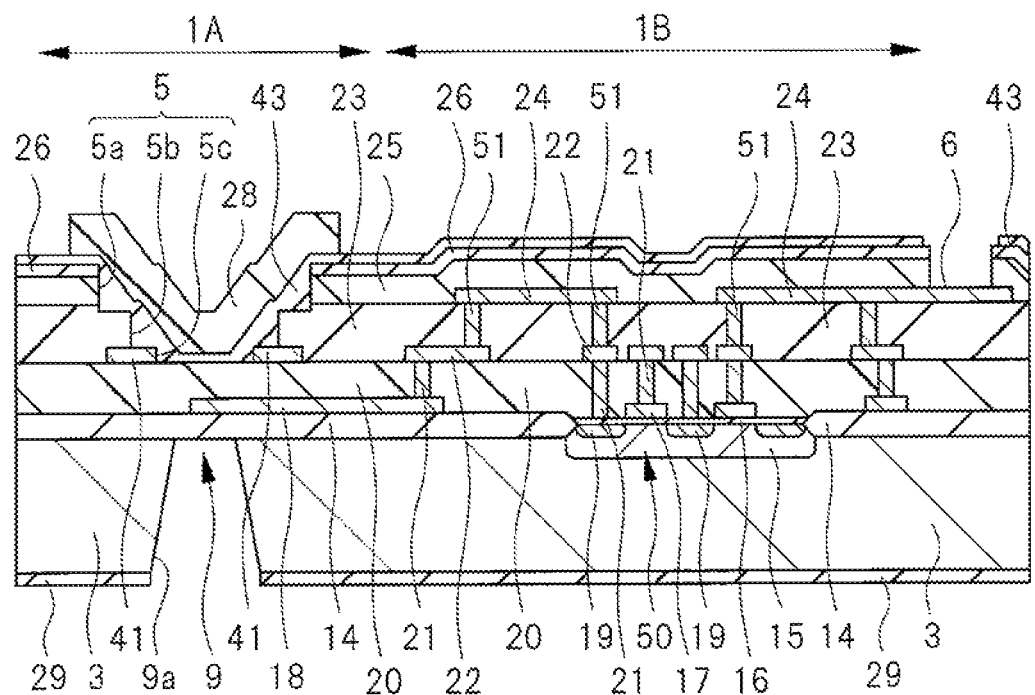
FIG. 23 is a cross-sectional view during the process of manufacturing the thermal fluid flow sensor continuous to FIG. 22.

Hereinafter, a method of manufacturing the thermal fluid flow sensor according to the present embodiment will be described with reference to FIGS. 21 to 23. FIGS. 21 to 23 are cross-sectional views during the process of manufacturing the thermal fluid flow sensor according to the present embodiment. The semiconductor substrate 3 illustrated in FIGS. 21 to 23 includes the air flow measurement section 1A and the circuit section 1B which are arrayed side by side in the direction along the main face of the semiconductor substrate 3, which is similar to FIGS. 5 to 12.

First, processes which are the same as the processes that have been described with reference to FIGS. 15 to 18 are performed. Accordingly, the concave portion 5 including the concave portions 5a, 5b and 5c is formed in the upper face of the stacked insulating film on a sensor of the air flow measurement section 1A.

Next, an insulating film 43 made of a silicon oxide film is formed to cover the protective film 26, the side wall and the bottom face of the concave portion 5, and the electrode pad 6. Herein, the insulating film 43 is formed by repeatedly performing deposition (film formation) and etching inside a single apparatus (chamber). When such a film formation method is used, it is possible to form the insulating film 43 having the inclination on the surface thereof between the side wall and the bottom face of the concave portion instead of a film that extends along the side wall and the bottom face of the concave portion inside each concave portion.

That is, a face (face on a lower side) of the insulating film 43, which opposes the side wall and the bottom face of the concave portion 5 is in contact with the side wall and the bottom face of the concave portion 5, but a part of a face of the insulating film 43 on an upper side has an inclination angle with respect to the main face of the semiconductor substrate 3 inside the concave portion 5. That is, a concave portion is formed in the upper face of the insulating film 43 in the air flow measurement section 1A, and the side wall of the concave portion has an inclination from an end of a bottom face of the concave portion to the upper face of the insulating film 43 at an outer side of the concave portion. Herein, an inclination face, which is formed from the end of the bottom face of the concave portion to the outer side of the concave portion inside the concave portion formed in the upper face of the insulating film 43, is referred to as a side wall of the concave portion.

A part of the side wall of the concave portion is formed along the bottom face of the concave portion 5b, and thus, a step is formed in the side wall of the concave portion. The insulating film 43 is formed using, for example, an HDP (High Density Plasma) CVD method or the like.

Next, the insulating film 28 having the tensile stress is formed in the air flow measurement section 1A by performing process the same as the process that has been described with reference to FIG. 19 as illustrated in FIG. 22. At this time, the insulating film 28 is formed along a surface of the insulating film 43. Thus, insulating film 28 formed along the side wall of the concave portion formed in the upper face of the insulating film 43 inside the concave portion 5 is formed to have a uniform film thickness in an oblique direction with respect to the main face of the semiconductor substrate 3. That is, the insulating film 28 is not formed along each side wall of the concave portions 5a, 5b and 5c.

Accordingly, the insulating film 28 is not formed at the corner of the concave portion 5. However, it is possible to consider a case where a step is also formed in the side wall of the concave portion formed in the upper face of the insulating film 43 inside the concave portion 5 as the step is formed in the side wall of the concave portion 5 so that a step is formed in the middle of the inclination face of the insulating film 28 inside the concave portion 5. However, the step formed in the insulating film 28, formed along a slope as the side wall of the concave portion, is relatively small. That is, it is possible to prevent the deterioration of the coverage caused due to the insulating film 28 when the insulating film 28 is folded at an angle close to 90 degrees by causing the insulating film 28 inside the concave portion 5 to be inclined.

Accordingly, it is possible to prevent the generation of the void and the stress concentration caused by the deterioration of the coverage in the stepped portion of the insulating film 28. Accordingly, it is possible to enhance the coatability obtained by the insulating film 28, and thus, it is possible to form the sensor chip having the high tolerance with respect to the thermal stress and the high moisture-proof property.

Herein, it is difficult to form the insulating film 43 having the inclination in a case were the above-described insulating film 43 is formed to cover the side wall and the bottom face of the concave portion 30 according to the comparative example illustrated in FIG. 30 because the depth of the concave portion 30 is relatively deep.

In regard to this, the plurality of steps are provided in the side wall of the concave portion 5 in the present embodiment by forming the concave portion 5 using the concave portions 5a, 5b and 5c as illustrated in FIG. 22. Accordingly, it is possible to reduce a maximum film thickness of the insulating film 43 to be formed on the plurality of steps, and thus, it is possible to easily form the insulating film 43 having the inclined surface at a short period of time.

Next, the insulating film 43 immediately above the electrode pad 6 is removed using a photolithography method and an etching method to expose the electrode pad 6 from the insulating film 43 as illustrated in FIG. 23. Thereafter, the insulating film 29 and the hole 9a are formed by performing a process the same as the process that has been described with reference to FIG. 20. Accordingly, the sensor chip 52 including the diaphragm 9 is formed. It is possible to form the thermal fluid flow sensor according to the present embodiment in the subsequent processes by performing processes the same as the processes that have been described with reference to FIGS. 13 and 14.

(Fourth Embodiment)

A thermal fluid flow sensor according to the present embodiment is different from the one according to the above-described first embodiment in term that a corner at a bottom side of a concave portion of the air flow measurement section 1A has roundness.

Hereinafter, a method manufacturing the thermal fluid flow sensor according to the present embodiment will be described with reference to FIGS. 24 to 28. FIGS. 24 to 28 are cross-sectional views during the process of manufacturing the thermal fluid flow sensor according to the present embodiment. The semiconductor substrate 3 illustrated in FIGS. 24 to 28 includes the air flow measurement section 1A and the circuit section 1B which are arrayed side by side in the direction along the main face of the semiconductor substrate 3, which is similar to FIGS. 5 to 12. In addition, the layout of the thermal fluid flow sensor according to the present embodiment will be described with reference to FIG. 29. FIG. 29 is a plan view illustrating the thermal fluid flow sensor according to the present embodiment.

First, processes which are the same as the processes that have been described with reference to FIGS. 5 to 8 are performed. Accordingly, a stacked insulating film including the interlayer insulating films 20 and 23, the insulating film 25, and the protective film 26 is formed on the sensor in the air flow measurement section 1A.

Figure 24:
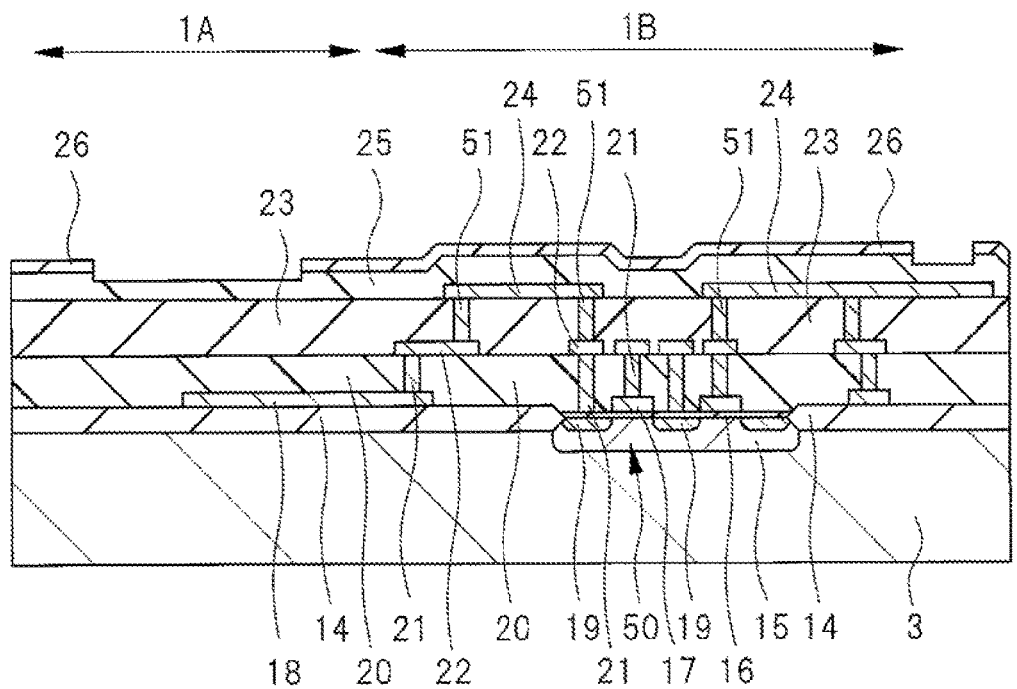
FIG. 24 is a cross-sectional view of a process of manufacturing a thermal fluid flow sensor according to a fourth embodiment.

Next, the protective film 26 is patterned using a photolithography method and a dry etching method to expose the upper face of the insulating film 25 in the region to form the electrode pad for the connection between the sensor chip and the outside as illustrated in FIG. 24. In addition, in this etching process, the upper face of the insulating film 25 is exposed from the protective film 26 in the air flow measurement section 1A to form a diaphragm later. At this time, it is possible to consider a case where a part of the upper face of the insulating film 25 retreats by the etching process, and a concave portion is formed in the upper face of the insulating film 25.

Figure 25:
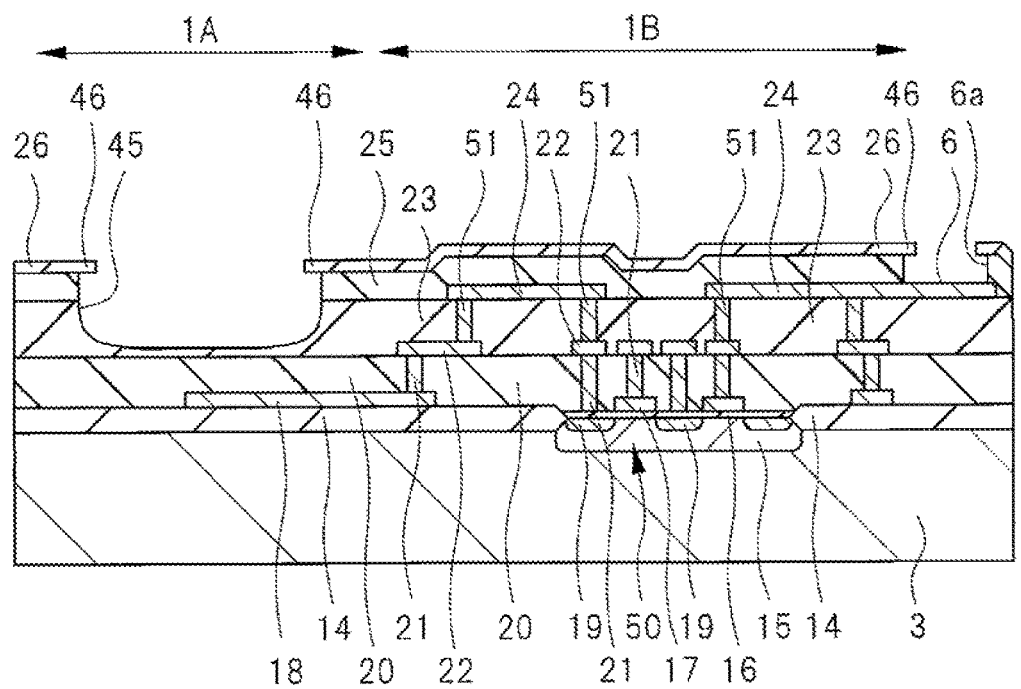
FIG. 25 is a cross-sectional view during the process of manufacturing the thermal fluid flow sensor continuous to FIG. 24.

Next, a part of the insulating film 25 is removed by performing wet etching using the protective film 26 as a mask and using an etchant containing a hydrogen fluoride solution as the main component as illustrated in FIG. 25. Herein, a concave portion (opening) 6a having a bottom face from which the upper face of the wiring 24 is exposed is formed by removing the insulating film 25 that is exposed from the protective film 26. Accordingly, the upper face of the exposed wiring 24 is used as the electrode pad 6 for the connection between the sensor chip and the outside. In addition, the insulating film 25 and the interlayer insulating film 23 exposed from the Protective film 26 in the air flow measurement section 1A are removed in this etching process. A concave portion 45 is formed in an upper face of a stacked film of the interlayer insulating film 23 and the insulating film 25, exposed from the concave portion of the protective film 26 in the air flow measurement section 1A, through this etching.

It is possible to control an etching rate by accurately controlling temperature of the solution in the above-described etching using the hydrogen fluoride solution, and thus, it is possible to uniformly keep each etching amount of the insulating film 25 and the interlayer insulating film 23 exposed from the protective film 26. Accordingly, it is possible to uniformly remove the insulating film 25 and the interlayer insulating film 23 inside a wafer plane. Incidentally, the protective film 26 made of the silicon nitride film has a high selection ratio relative to the etchant, and thus, is hardly removed in the etching process but can be used as the mask.

Herein, the directivity of etching is isotropic since this etching process is the wet etching. Accordingly, the concave portion 45 formed by the etching (isotropic etching) has a shape in which a boundary between the bottom face and a side wall has the roundness.

That is, a surface of the insulating film exposed at the inner side of the concave portion 45 has a curved face between a bottom side and the side wall of the concave portion 45, and an angle is not formed at the boundary between the bottom face and the side wall of the concave portion 45. Thus, the surface of the insulating film exposed at the inner side of the concave portion 45 illustrated in FIG. 25 is smoothly linked between the bottom face and the side wall of the concave portion 45 as compared to the corner of the concave portion 30 formed by the dry etching method as in the comparative example that has been described with reference to FIG. 30.

Herein, the side etching of the insulating film 25 is performed in a lateral direction, and an overhang 46 at which an end of the protective film 26 on the concave portion 6a and on the concave portion 45 overhangs is formed. That is, the end of the protective film 26 opened immediately above the concave portion 45 terminates at a position closer to the center of the concave portion 45 than the side wall of the concave portion 45 when seen in a plan view. Accordingly, the protective film 26 protrudes more than the side wall of the concave portion 45, and thus, is formed in an cave shape. Incidentally, the bottom face of the concave portion 45 may reach a middle depth of the interlayer insulating film 20.

Figure 26:
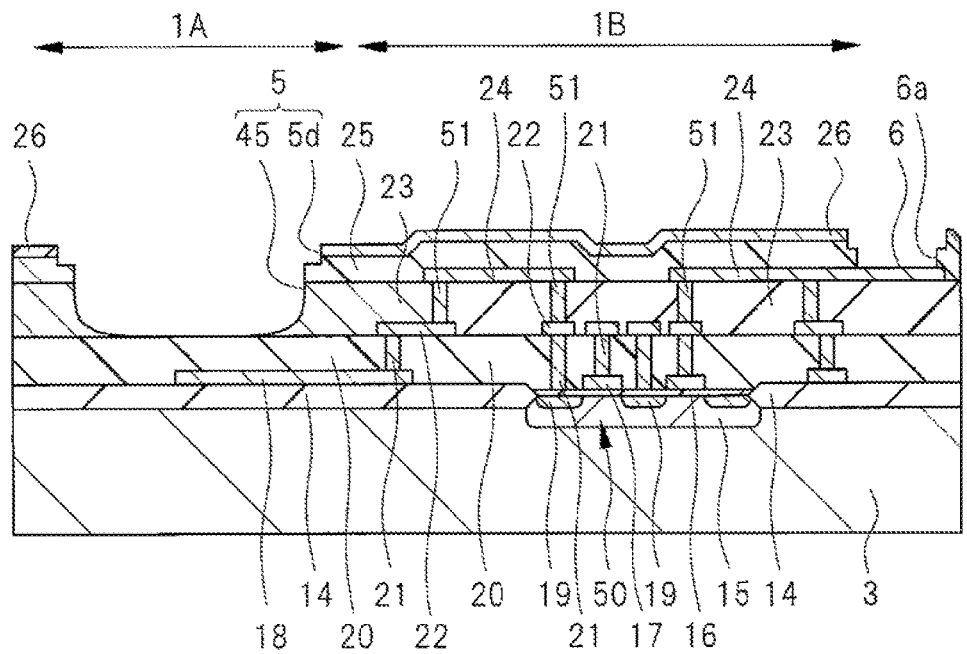
FIG. 26 is a cross-sectional view during the process of manufacturing the thermal fluid flow sensor continuous to FIG. 25.

Next, the overhang 46, which is the protective film 26 at each of an upper end of the concave portion 6a exposing the electrode pad 6 and an upper end of the concave portion 45, is removed using a photolithography method and a dry etching method as illustrated in FIG. 26. Accordingly, the protective film 26 immediately above the concave portion 45 and immediately above the electrode pad 6 is removed. The removal of the overhang 46 is performed because the insulating film 28 is not formed in the vicinity of a bottom face of the overhang 46 having the cave shape in a film formation process of the insulating film 28 to be described later with reference to FIG. 27, and there occurs a problem that strength of the insulating film 28 is degraded. Incidentally, the bottom face of the concave portion 45 is etched back in this etching process so that the bottom face retreats to the semiconductor substrate 3 side.

Herein, the protective film 26 in a wider region than the concave portion 6a is removed such that the protective film 26 terminates at the outer side than the concave portion 6a when seen in a plan view. Similarly, the protective film 26 in a wider region than the concave portion 45 is removed such that the protective film 26 terminates at the outer side than the concave portion 45 when seen in a plan view. At this time, it is possible to consider a case where a part of the upper face of the insulating film 25 immediately below the protective film is removed together with the protective film 26.

A concave portion 5d is formed on a top of a stacked film of the insulating film 25 and the protective film 26 at a position adjacent to the concave portion 45 in the air flow measurement section 1A through this etching process. Accordingly, the concave portion 5 including the concave portion 5d and the concave portion 45 is formed. Since the concave portion 5 is configured using the plurality of concave portions, stair-like steps are formed in the side wall of the concave portion 5.

Herein, the top of the stacked film is removed using a dry etching method, and thus, a corner between a side wall and a bottom face of the concave portion 5d formed by the etching process has an angle close to a right angle. Meanwhile, it is possible to consider a case where the corner is actually small and has the roundness. Even in such a case, the end of the bottom face of the concave portion 45 formed by the wet etching has the greater roundness than the corner of the concave portion 5d. in other words, the curved face between the side wall and the bottom face of the concave portion 45 has a larger curvature radius than the corner of the concave portion 5d.

In addition, the concave portion 6a is a concave portion (opening) that is formed by the wet etching to form the concave portion 45. However, when the concave portion 6a is formed using the wet etching method, a depth of the concave portion 6a is extremely smaller than the depth of the concave portion 45 since the upper face of the wiring 24 works as the stopper film, which is different from the concave portion 45. That is, when the insulating film 25 on the electrode pad 6 is opened, the concave portion 6a is expanded as the insulating film 25 retreats in the lateral direction along the main face of the semiconductor substrate 3 after the upper face of the wiring 24 is exposed during the wet etching process.

That is, the wet etching is isotropic etching, but the concave portion 6a is mainly formed by side etching. Accordingly, even if the corner between the side wall and the bottom face of the concave portion 6a has roundness, the roundness is relatively small. In other words, the curved face between the side wall and the bottom face of the concave portion 45 has a larger curvature radius than the corner between the side wall and the bottom face of the concave portion 6a.

Figure 27:
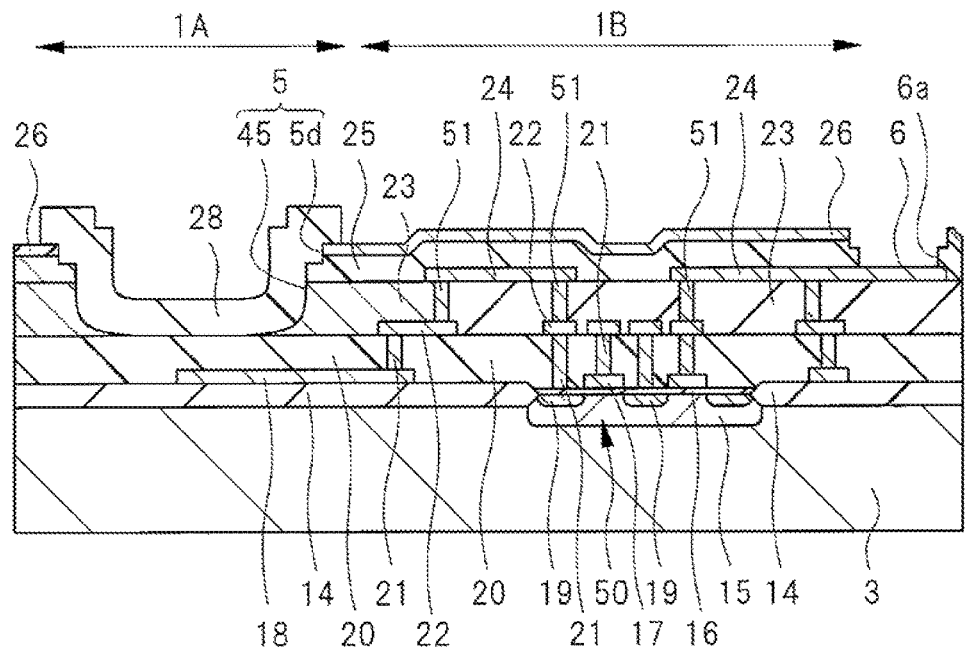
FIG. 27 is a cross-sectional view during the process of manufacturing the thermal fluid flow sensor continuous to FIG. 26.

Next, the insulating film 28 having the tensile stress is formed in the air flow measurement section 1A by performing process the same as the process that has been described with reference to FIG. 11 as illustrated in FIG. 27. At this time, the insulating film 28 is formed along the surface of the insulating film exposed at the inner side of the concave portion 45. That is, the insulating film 28 is formed along a surface that is smoothly continued from the side wall to the bottom face inside the concave portion 45.

That is, a corner at which the coverage deteriorates when the insulating film 28 is embedded is not formed in the concave portion 45. Thus, the insulating film 28 inside the concave portion 45 is formed to have a uniform film thickness. Accordingly, it is possible to prevent the generation of the void and the stress concentration caused by the deterioration of the coverage of the insulating film 28 formed inside the concave portion 45. When the coatability of the insulating film 28 is enhanced in this manner, it is possible to form the sensor chip having the high tolerance with respect to the thermal stress and the high moisture-proof property.

Figure 28:
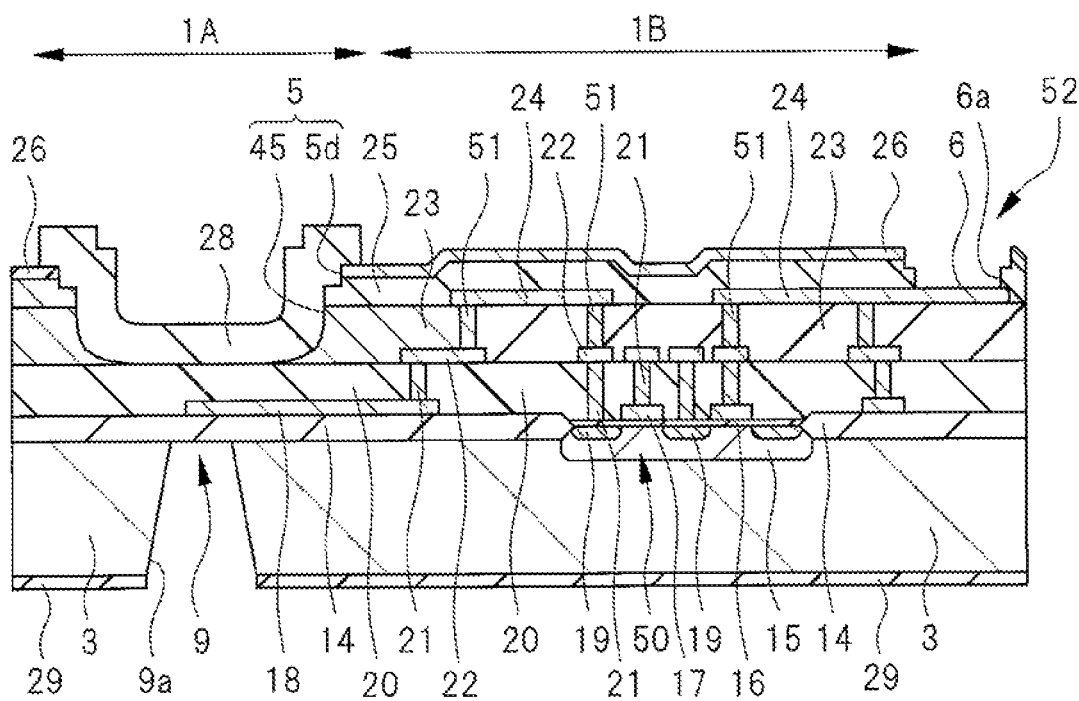
FIG. 28 is a cross-sectional view during the process of manufacturing the thermal fluid flow sensor continuous to FIG. 27.
Figure 29:
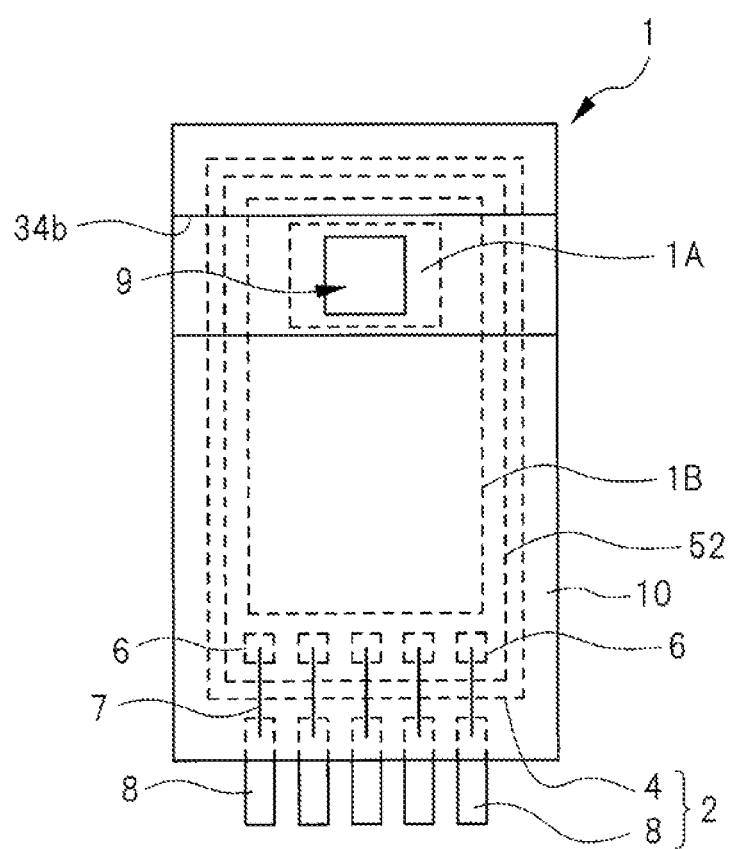
FIG. 29 is a plan view illustrating the thermal fluid flow sensor according to the fourth embodiment.

Next, the insulating film 29 and the hole 9a are formed as illustrated in FIG. 28 by performing a process the same as the process that has been described with reference to FIG. 20. Accordingly, the sensor chip 52 including the diaphragm 9 is formed. It is possible to form the thermal fluid flow sensor according to the present embodiment in the subsequent processes by performing processes the same as the processes that have been described with reference to FIGS. 13 and 14.

Incidentally, the description has been given in the above-described first embodiment regarding the case where the elements and the wirings, and the like forming the circuit section 1B are provided only between the air flow measurement section 1A and the electrode pad 6 as illustrated in FIG. 1. However, the circuit section 1B may be provided to surround the air flow measurement section 1A when seen in a plan view as illustrated in FIG. 29. The layout of FIG. 1 or 29 can be applied to any of the first to fourth embodiments.

Although the description has been given in detail regarding the invention made by the present inventors based on the embodiments as above, the present invention is not limited to the embodiments, and, of course, can be modified in various ways within a scope not departing from a gist thereof.

INDUSTRIAL APPLICABILITY

The present invention can be widely used in the thermal fluid flow sensor including the diaphragm.

REFERENCE SIGNS LIST 1 thermal fluid flow sensor
1A air flow measurement section
1B circuit section
3 semiconductor substrate
5, 5a to 5d, 6a, 30, 45 concave portion
6 electrode pad
9 diaphragm
14 element isolation region
18 heater (heating resistor)
20, 23 interlayer insulating film
21, 51 contact plug
22, 24 wiring
25, 28, 29, 43 insulating film
26 protective film
50 MOS transistor
52, 53 sensor chip

The invention claimed is:

1. A thermal fluid flow sensor comprising:
a semiconductor substrate;
a heating resistor and a measuring element that are formed in a diaphragm provided in the semiconductor substrate;
a first insulating film that is formed on each of the heating resistor and the measuring element;
a first concave portion that is formed in an upper face of the first insulating film immediately above each of the heating resistor and the measuring element, the first concave portion includes a second concave portion and a third concave portion which is formed immediately above the second concave portion and has a larger opening width than the second concave portion and the third concave portion reaches a middle depth of the first insulating film; and
a second insulating film that covers a side wall and a bottom face of the first concave portion, wherein
the first concave portion includes a stair-like step in a side wall,
wherein the first insulating film includes a silicon oxide film and has a stress on a compression side, and
the second insulating film includes a silicon nitride film and has a stress on a tensile stress side as compared to the first insulating film.

2. The thermal fluid flow sensor according to claim 1, wherein
a height of the step is smaller than a film thickness of the second insulating film.

3. The thermal fluid flow sensor according to claim 1, wherein
the semiconductor substrate has a first region and a second region which neighbor on each other in a direction along a main face of the semiconductor substrate,
the diaphragm is formed in the first region, and
a circuit to control the heating resistor and the measuring element is formed in the second region.

4. The thermal fluid flow sensor according to claim 3, wherein
the step of the first insulating film is formed using an insulating film on a same layer as a wiring layer which is electrically connected to the heating resistor, the measuring element, or the circuit.

5. The thermal fluid flow sensor according to claim 1, wherein
a fourth concave portion is formed in an upper face of the second insulating film immediately above the first concave portion, and
a stair-like step is formed in a side wall inside the fourth concave portion.

6. The thermal fluid flow sensor according to claim 5, wherein
a width of a bottom face of the fourth concave portion is larger than a width between an end of the bottom face of the fourth concave portion and a terminal end of the second insulating film in a direction along a main face of the semiconductor substrate.

* * * * *